US012406736B2

(12) United States Patent
Oyama et al.

(10) Patent No.: US 12,406,736 B2
(45) Date of Patent: Sep. 2, 2025

(54) SEMICONDUCTOR MEMORY DEVICE

(71) Applicant: NSCore, Inc., Fukuoka (JP)

(72) Inventors: Kazuhiko Oyama, Fukuoka (JP); Tadahiko Horiuchi, Fukuoka (JP)

(73) Assignee: NSCore, Inc., Fukuoka (JP)

( * ) Notice: Subject to any disclaimer, the term of this patent is extended or adjusted under 35 U.S.C. 154(b) by 93 days.

(21) Appl. No.: 18/091,839

(22) Filed: Dec. 30, 2022

(65) Prior Publication Data

US 2024/0170074 A1 May 23, 2024

(30) Foreign Application Priority Data

Nov. 18, 2022 (JP) ................................. 2022-185262

(51) Int. Cl.
*H10B 43/00* (2023.01)
*G11C 16/04* (2006.01)
*G11C 16/08* (2006.01)
*G11C 16/24* (2006.01)
*G11C 16/26* (2006.01)
*G11C 16/30* (2006.01)

(52) U.S. Cl.
CPC .......... *G11C 16/26* (2013.01); *G11C 16/0466* (2013.01); *G11C 16/0483* (2013.01); *G11C 16/08* (2013.01); *G11C 16/24* (2013.01); *G11C 16/30* (2013.01); *H10B 43/00* (2023.02)

(58) Field of Classification Search
CPC ..... G11C 16/26; G11C 16/0483; G11C 16/08; G11C 16/24; G11C 16/30; G11C 16/0466; H10B 43/00; H01L 23/5283
See application file for complete search history.

(56) References Cited

U.S. PATENT DOCUMENTS

| 5,177,568 | A  | * | 1/1993  | Honma ................ | H10D 64/647 |
| | | | | | 257/295 |
| 7,151,706 | B2 | * | 12/2006 | Nakamura ............ | G11C 14/00 |
| | | | | | 365/189.05 |
| 7,227,234 | B2 | * | 6/2007  | Roizin ................. | H10D 64/037 |
| | | | | | 257/E27.06 |
| 7,733,714 | B2 | * | 6/2010  | Horiuchi ............. | G11C 11/5671 |
| | | | | | 365/189.12 |
| 9,893,208 | B2 |   | 2/2018  | Horiuchi | |
| 9,966,141 | B2 |   | 5/2018  | Horiuchi | |
| 11,315,949 | B2 | * | 4/2022 | Herrmann ............... | H10D 8/60 |
| 2006/0125041 | A1 | * | 6/2006 | Yang .................. | H10D 30/0221 |
| | | | | | 257/E21.345 |
| 2009/0251962 | A1 | * | 10/2009 | Yun .................... | G11C 16/3427 |
| | | | | | 365/185.17 |
| 2010/0214842 | A1 | * | 8/2010 | Honda ............... | G11C 16/0483 |
| | | | | | 365/189.11 |
| 2011/0133273 | A1 | * | 6/2011 | Shima .................. | H10D 30/603 |
| | | | | | 257/E29.268 |

(Continued)

*Primary Examiner* — Amir Zarabian
*Assistant Examiner* — Justin Bryce Heisterkamp
(74) *Attorney, Agent, or Firm* — Quarles & Brady LLP

(57) ABSTRACT

A semiconductor memory device includes a bit line pairs, a source line, a word line, and a memory cell array including a plurality of memory cells arranged in a row and column directions, wherein the memory cell is a pair of p-type transistors formed on an n-type well, wherein one of terminals of the transistor is a Schottky barrier junction consisting of a metal thin film formed on the n-type well, and the other terminal is connected to the source line.

8 Claims, 35 Drawing Sheets

(56) References Cited

U.S. PATENT DOCUMENTS

| | | | |
|---|---|---|---|
| 2011/0169100 A1* | 7/2011 | Shimizu | H10D 1/47 |
| | | | 257/E21.495 |
| 2015/0076553 A1* | 3/2015 | Kondo | H10D 30/0221 |
| | | | 257/105 |
| 2016/0217832 A1* | 7/2016 | Jayaraman | G11C 7/08 |
| 2017/0243649 A1* | 8/2017 | Horiuchi | G11C 7/065 |
| 2022/0028467 A1* | 1/2022 | Choi | G11C 11/5628 |
| 2022/0415403 A1* | 12/2022 | Bhat | G06F 3/0659 |
| 2023/0284427 A1* | 9/2023 | Augustine | H10D 84/038 |
| | | | 365/156 |

* cited by examiner

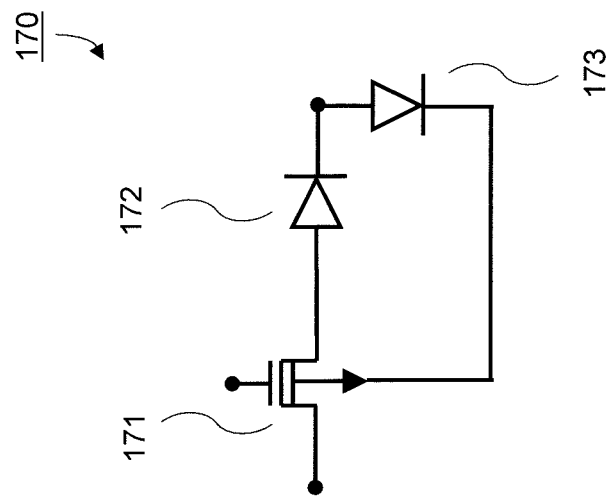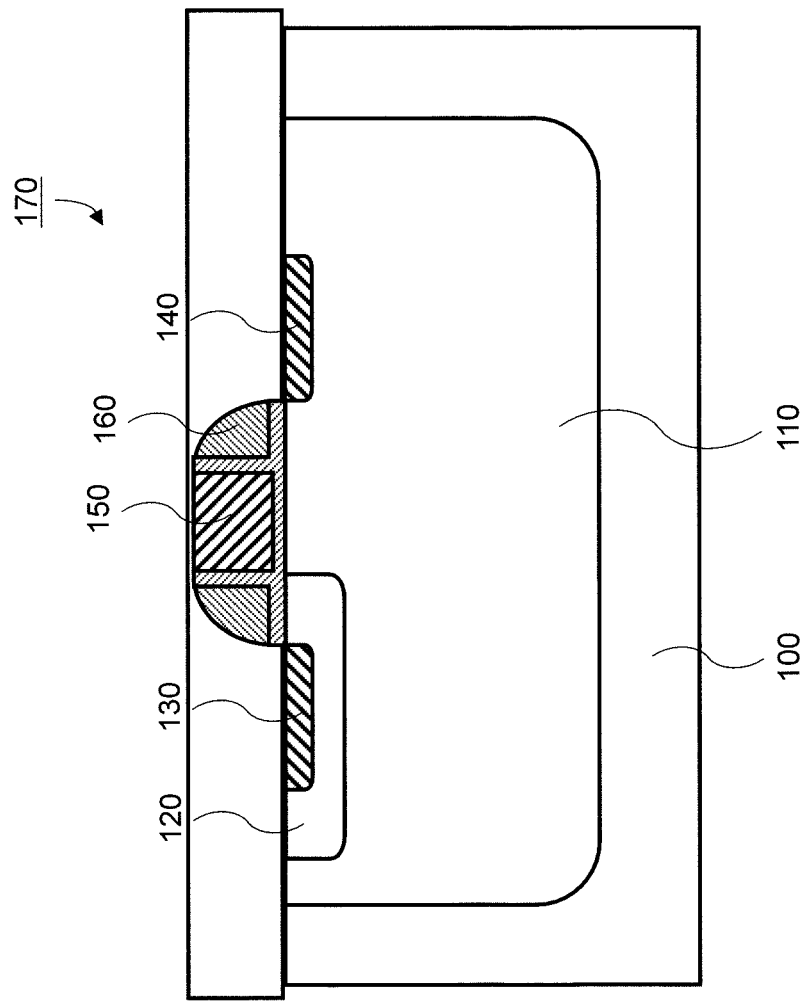
FIG.1A
FIG.1B

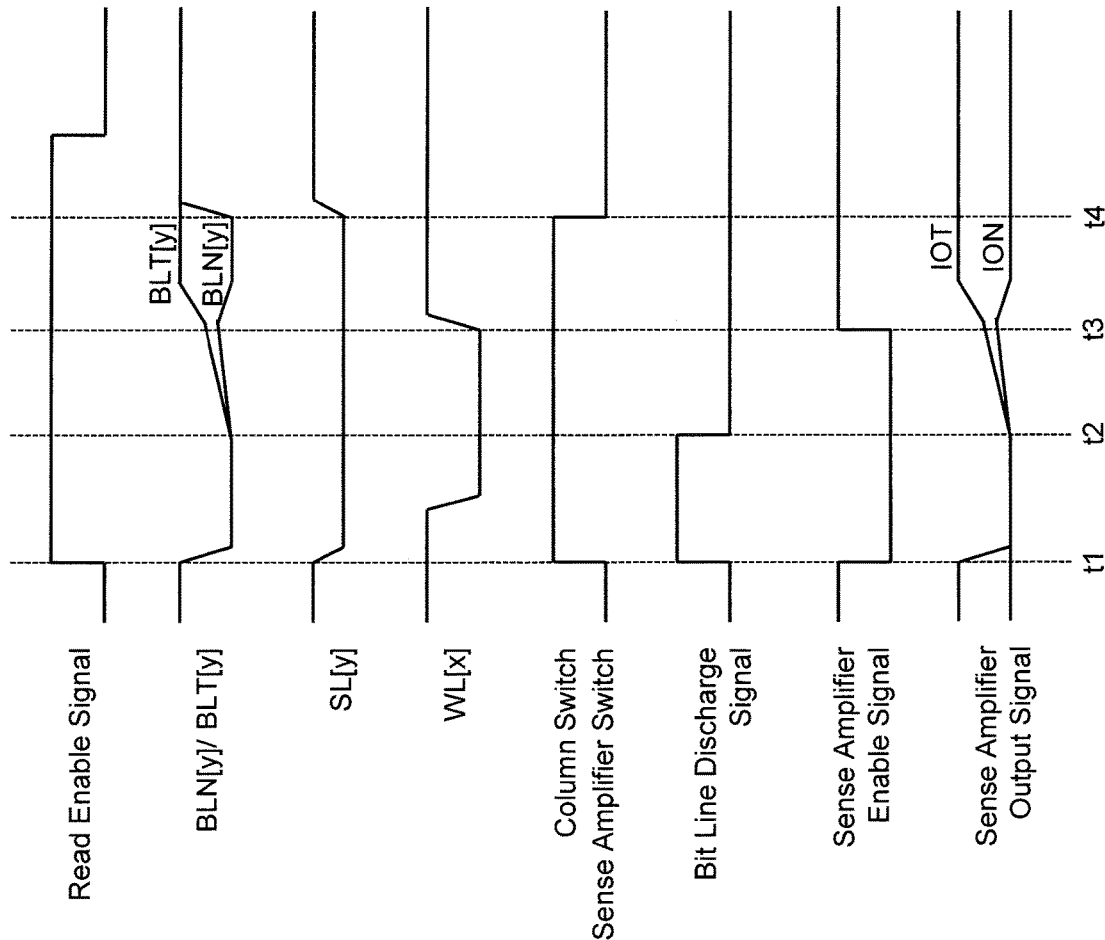

SEMICONDUCTOR MEMORY DEVICE

CROSS-REFERENCE TO RELATED APPLICATION(S)

This application claims the benefit of priority to Japanese Patent Application No. 2022-185262, filed on Nov. 18, 2022, the entire contents of which are incorporated herein by reference.

FIELD

Embodiments described herein relate generally to a semiconductor memory device.

BACKGROUND

The inventors of the present application have developed a semiconductor memory device. In this semiconductor memory device, a pair of transistors having a Schottky barrier junction formed on a p-type substrate is used as a memory cell, and avalanche hot electrons are trapped in an insulating film around a gate of the transistor, thereby holding data in a Nonvolatile manner. This semiconductor memory device (1) can be manufactured at low cost using a manufacturing process consistent with a CMOS process of a design rule of a minimum of several tens nanometers to several nanometers, and (2) can hold small to medium capacity data of several bits to several megabits in a Nonvolatile manner.

SUMMARY

It is an object of the present disclosure to provide a semiconductor memory device which has substantially improved reliability while maintaining the features of (1) low-cost manufacturing using the manufacturing process consistent with the CMOS process of the design rule of the minimum of several tens nanometers to several nanometers, and (2) small to medium capacity data of the several bits to the several megabits can be held in a Nonvolatile manner.

A semiconductor memory device according to an embodiment includes a bit line pair, a source line, a word line, and a memory cell array including a plurality of memory cells arranged in a row and column direction, wherein the memory cell is a pair of p-type transistors formed on an n-type well, wherein one of terminals of the transistor is a Schottky barrier junction consisting of a metal thin film formed on the n-type well, and the other terminal is connected to the source line.

BRIEF DESCRIPTION OF THE DRAWINGS

FIG. 1A is a diagram illustrating one configuration of a transistor pair constituting a memory cell used in a semiconductor memory device according to each of first embodiment to third embodiment.

FIG. 1B is an equivalent circuit diagram of a transistor pair constituting a memory cell used in a semiconductor memory device according to each of first embodiment to third embodiment.

FIG. 9B is a diagram illustrating the voltage of each node during the read operation period of the semiconductor memory device according to the first embodiment.

DETAILED DESCRIPTION

Figure 2:
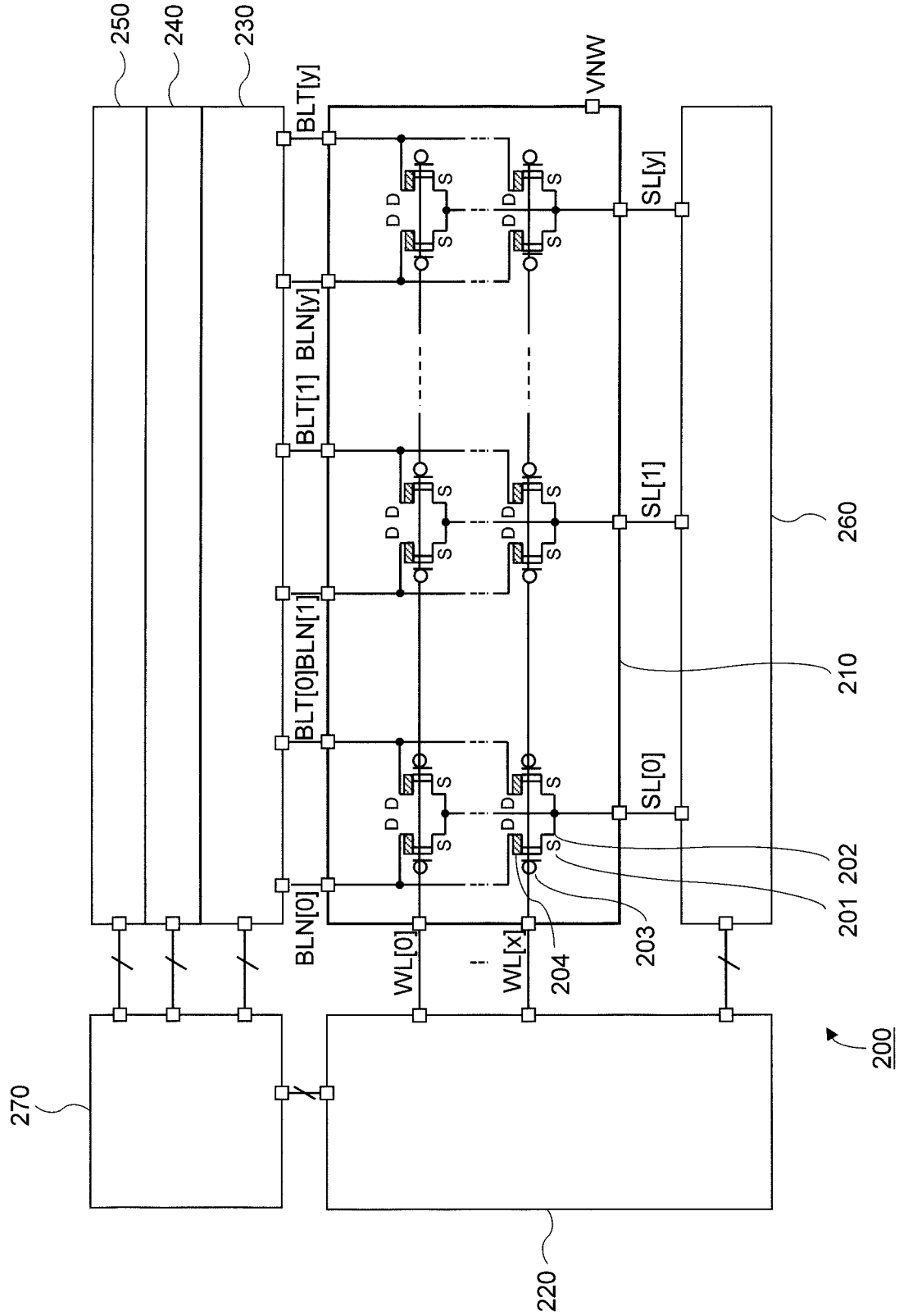
FIG. 2 is a circuit diagram of the semiconductor memory device according to the first embodiment.

Hereinafter, a semiconductor memory device according to each of the first to third embodiments will be described in detail with reference to drawings. In following descriptions, components having substantially same functions and configurations are denoted by same reference numerals, and duplicate description may be omitted. Each of the embodiments described below exemplifies an apparatus and a method for embodying a technical idea of each embodiment.

The technical idea of each embodiment is not limited to the following materials, shapes, structures, arrangements, and the like of components. Various modifications may be added to the technical idea of each embodiment with respect to the claims.

1. Structure of Transistor Composing Memory Cell

FIG. 1A and FIG. 1B are diagrams illustrating a configuration of a transistor 170 which is one of a pair of transistors composing a memory cell used in the semiconductor memory device according to each of the first to third embodiments. An n-type well 110 doped with an n-type impurity is formed in a p-type semiconductor substrate 100 made of silicon single crystal doped with p-type impurity (which may be a p-type well formed in a semiconductor substrate).

The transistor 170 is formed on the n-type well 110. The transistor 170 includes a p-type diffusion layer 120, a metal layer 130, a metal layer 140, a gate electrode 150, sidewalls 160, and the like. The p-type diffusion layer 120 in which the p-type impurity is diffused is formed in the n-type well 110. The metal layer 130 is formed in the p-type diffusion layer 120. The metal layer 140 is separated from the p-type diffusion layer 120 and formed in the n-type well 110 without the p-type diffusion layer 120 being interposed therebetween. The metal layer 130 and the metal layer 140 are formed of a nickel silicide (NiSi) layer, a cobalt silicide (CoSi) layer, a titanium silicide (TiSi) layer, a platinum silicide (PtSi) layer, or the like. These silicide layers are formed by forming a metal thin film such as nickel, cobalt, titanium, or platinum, and performing a heat treatment to silicide the surface of the silicon substrate. A Schottky barrier junction is formed between the metal layer 140 and the n-type well 110.

FIG. 1B is an equivalent circuit of the transistor 170 having the configuration shown in FIG. 1A. As shown, a p-type MOS transistor 171 and a Schottky diode 172 are connected in series. A p-type channel inversion layer of the p-type MOS transistor 171 serves as an anode of the Schottky diode 172, and the metal layer 140 serves as a cathode of the Schottky diode 172. At the same time, the metal layer 140 serves as an anode of a Schottky diode 173, and the n-type well 110 serves as a cathode of the Schottky diode 173.

The transistor 170 in the configuration shown in FIG. 1A can be manufactured using a typical CMOS process used for manufacturing a logic semiconductor device (CPU, GPU or the like). Therefore, it is suitable for forming on the same semiconductor substrate as a logic semiconductor device.

2-1. First Embodiment (Circuit Configuration)

FIG. 2 is a circuit diagram of a semiconductor memory device 200 according to a first embodiment. The semiconductor memory device 200 includes a memory cell array 210, a word line driving circuit 220, a column switch 230, a sense amplifier circuit 240, a data input/output circuit 250, a source line driving circuit 260, and a control circuit 270. The semiconductor memory device 200 may be provided as a single semiconductor memory device, or may be formed on a same semiconductor substrate together with other logic circuits. As described above, the transistor 170 can be manufactured using CMOS process which is common for manufacturing the logic semiconductor device (CPU, GPU or the like), so that the semiconductor memory device 200 and the logic semiconductor device (CPU, GPU or the like) can be manufactured at the same time without an additional process. The semiconductor memory device 200 is intended to be mounted with a logic semiconductor device, and may be provided as an IP core (connection information of circuit, mask image data used for manufacturing a semiconductor device, or the like).

In the memory cell array 210, a pair of two transistors (a right transistor and a left transistor) of the transistor 170 described in FIG. 1A and FIG. 1B is used as memory cells 201. The memory cells 201 are arranged in a matrix in x+1 rows (0, 1, . . . , x rows) y+1 columns (0, 1, . . . , y columns). The p-type diffusion layer 120 (and the metal layer 130, will be a source 202 at the time of reading) of the right transistor and the left transistor are commonly connected, and are connected to source lines SL[0] to SL[y]. The metal layer 140 of the right transistors belonging to the same column (the cathode of the Schottky diodes 172) are commonly connected to bit lines BLT[0] to BLT[y]. The metal layer 140 of the left transistors belonging to the same column (the cathode of the Schottky diode 172, will be a drain 204 at the time of reading) are commonly connected to bit lines BLN[0] to BLN[y]. The bit line BLT [0] and the bit line BLN [0], the bit line BLT [1] and the bit line BLN [1], and the bit line BLT [y] and the bit line BLN [y] form a pair, respectively. Gates 203 of the left and right transistors belonging to the same row are commonly connected to word lines WL[0] to WL[x]. All the transistors 170 of the memory cell array 210 are formed in one of the n-type well 110. The n-type well 110 is connected to a well voltage driving circuit (not shown).

The arrangement pattern of the transistor 170 of the memory cell array 210 can share the metal layers 140 of two transistors 170 arranged in the row direction, and the p-type diffusion layer 120 and the metal layer 130 of four transistors 170 of the two memory cells arranged in the row direction. In this way, the arrangement density of the memory cells can be increased.

The word line driver 220 supplies corresponding voltages to the word lines WL in each mode of data writing, data erasing, and data reading. The voltage to be supplied will be described later.

The column switch 230 supplies a corresponding voltage to the bit line pair BLT/BLN in each mode of data writing and data erasing, and connects the bit line pair BLT/BLN and the sense amplifier 240 in the data read operation. The voltage to be supplied will be described later.

The sense amplifier circuit 240 supplies a voltage to the bit line pair BLT/BLN based on the write data inputted from the data input/output circuit 250 in the data writing mode, detects the voltage of the bit line pair BLT/BLN and outputs the read data to the data input/output circuit 250 in the data read mode.

The data input/output circuit 250 takes in the write data supplied from the outside (from the outside of the device when the semiconductor memory device 200 is a single unit, or from the logic circuit when the semiconductor memory device 200 is formed on the same semiconductor substrate together with other logic circuits) and outputs the write data to the sense amplifier circuit 240. The data input/output circuit 250 outputs the read data provided from the sense amplifier circuit 240 to the outside.

The source line driving circuit 260 supplies a corresponding voltage to source lines SL in each mode of data writing, data erasing, and data reading. The voltage to be supplied will be described later.

The control circuit 270 controls the operation of the voltage supply circuit (the word line driving circuit 220, the column switch 230, the sense amplifier circuit 240, the source line driving circuit 260, and the well driving circuit) in each mode of data writing, data erasing, and data reading. The control circuit 270 may include a high voltage generation circuit and a negative voltage generation circuit, which will be described later.

2-2. First Embodiment (Supply Voltage)

Operations of the semiconductor memory device 200 according to the first embodiment in the write mode, the erase mode, and the read mode will be described. The respective supply voltages in the respective modes of the first embodiment are shown in Table 1.

TABLE 1

|  | Write | Erase | Read |
|---|---|---|---|
| VWL | 2.2 [V] | 3.2 [V] | 2.2 [V] |
| VEE | −5.0 [V] | 0 [V] | −1.5 [V] |
| VBL | 1.8 [V] | 2.2 [V] | 2.2 [V] |
| VNW | 3.8 [V] | 2.2 [V] | 2.2 [V] |
| VSL | 1.8 [V] | 2.2 [V] | 1.0 [V] |

VWL is a voltage supplied to the word line WL of the unselected row. VEE is a voltage supplied to the word line WL of the selected row. VBL is a voltage mainly supplied to the bit line pair of the unselected column and the source line of the unselected column. VNW is a voltage mainly supplied to the n-type well. VSL is a voltage mainly supplied to the selected source line SL in the erase mode and the read mode. The respective supply voltages shown in Table 1 are exemplary, but in the write mode, the relation of VNW>VWL>VBL, VSL>0V(GND)>VEE must be satisfied. In the erase mode, the relation of VWL>VBL, VNW, VSL>VEE is satisfied. In the read mode, the relation of VWL, VBL, VNW>VSL>0V(GND)>VEE is satisfied. Among these voltages, a voltage higher than a power supply voltage externally supplied to the semiconductor memory device is generated by the high voltage generation circuit (including a charge pump circuit) not shown in FIG. 2. Among these voltages, a negative voltage is generated by the negative voltage generation circuit (including the charge pump circuit) not shown in FIG. 2.

2-2-1. First Embodiment (Write Mode)

Figure 3:
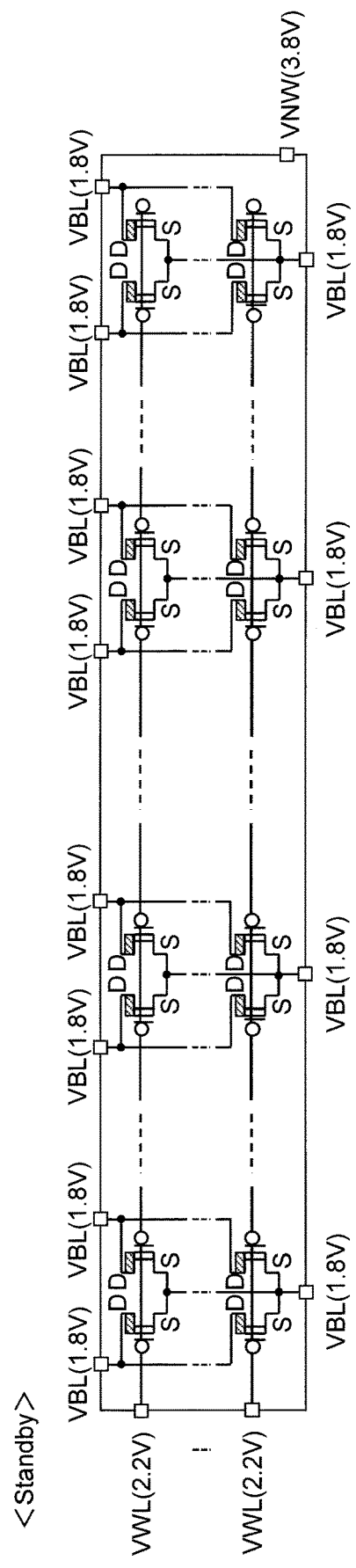
FIG. 3 is a diagram illustrating voltages supplied to a memory cell during a write standby period of the semiconductor memory device according to the first embodiment.
Figure 4:
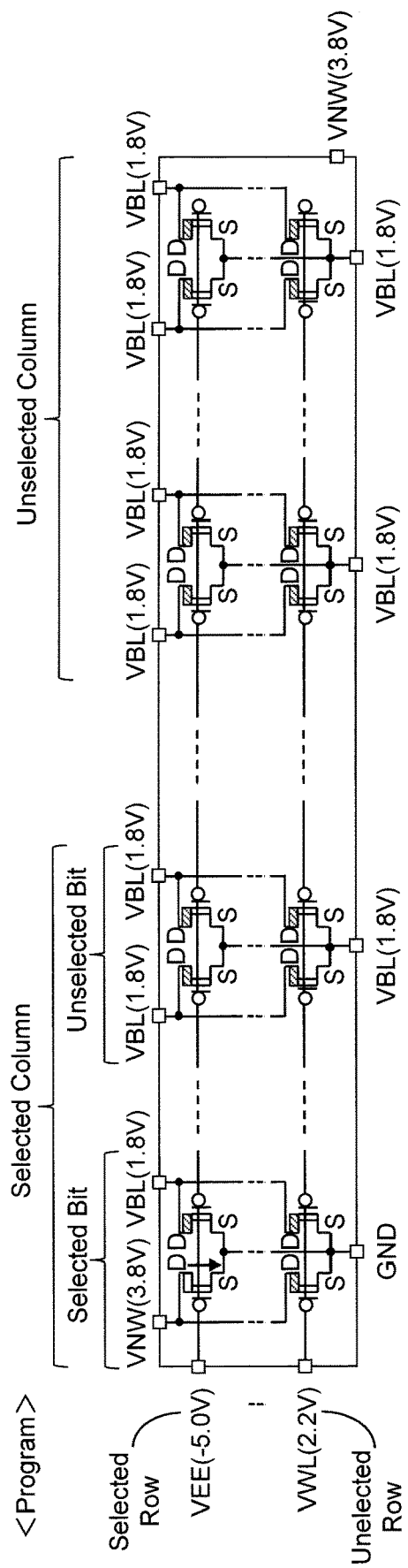
FIG. 4 is a diagram illustrating voltages supplied to the memory cell during a write operation period of the semiconductor memory device according to the first embodiment.

FIG. 3 is a diagram illustrating voltages supplied to the memory cells during the write standby period of the semiconductor memory device according to the first embodiment. FIG. 4 is a diagram illustrating voltages supplied to the memory cells during a write operation period following the write standby period of the semiconductor memory device according to the first embodiment. A case where "0" data is written in the selected memory cell is shown as an example.

As shown in FIG. 3, during the write standby period, the voltage supply circuit (the word line driving circuit 220, the column switch 230, the sense amplifier circuit 240, the source line driving circuit 260, and the well driving circuit) supplies VBL (1.8V) to all the bit line pairs, VWL (2.2V) to all the word lines WL, VBL (1.8V) to all the source lines SL, and VNW (3.8V) to the n-type well.

In the memory cell array, a group of a plurality of bits corresponding to a data length is arranged in the column direction. If the data length is 8 bits and a number of columns in the group is 256, y+1 is 2048. If a number of word lines is 2048, there are 4194304 memory cells (transistor pairs) and a storage capacity is 4 Mbit (512 byte). In FIG. 4, a selected column group is indicated as Selected Column, and an unselected column group is indicated as Unselected Column. In the column group, a column of memory cells corresponding to the data length is included, and a memory cell that performs each operation of writing and erasing is indicated as Selected Bit, and a memory cell that does not perform each operation is indicated as Unselected Bit.

As shown in FIG. 4, during the write operation period, the voltage supply circuit provides VNW (3.8V) to BLN connected to the selected memory cell and continues to provide VBL (1.8V) to BLT connected to the selected memory cell and all remaining bit line pairs. The voltage supply circuit provides the selected word line WL with VEE (−5.0V) and the unselected word line WL with VWL (2.2V). The voltage supply circuit provides the source lines SL connected to the selected memory cells with GND (0V) and the other source lines SL with VBL (1.8V). The voltage supply circuit continues to supply VNW (3.8V) to the n-type well.

A following operation is performed by applying voltages shown in FIG. 4. In the left transistor (connected to BLN) of the selected memory cell, VEE (−5.0V) is applied to the gate, so that a channel area immediately below the gate conducts, and GND (0V) supplied to the source line SL and VNW (3.8V) supplied to the bit line BLN are applied to the Schottky barrier junction. As a result, avalanche hot holes are created at the Schottky barrier junction. This avalanche hot hole is trapped in a sidewall of the transistor by VEE (−5.0V) applied to the gate. This hole shifts an effective threshold voltage of the transistor to negative (for example, −2.0V).

On the other hand, in the right transistor (connected to BLT) of the selected memory cell, the voltage supplied to the bit-line BLT is VBL (1.8V), so that an avalanche hot hole is not generated at the Schottky barrier junction. Therefore, the effective threshold voltage of the transistor is not shifted to negative. The same applies to the left and right transistors of the memory cells in the unselected column.

In memory cells of unselected rows, VWL (2.2V) is applied to the gate, so that the channel areas directly below the gate remain non-conducting and no avalanche hot holes is not generated at the Schottky barrier junction. Therefore, the effective threshold voltage of the transistor is not shifted to negative.

As described above, only the effective threshold voltage of the left transistor of the selected memory cell can be shifted to the negative value.

In case of writing "1" to the selected memory cell, 3.8V is applied to the bit line BLT connected to the right transistor during the write operation. Only the effective threshold voltage of the right transistor of the selected memory cell can be shifted to negative.

2-2-2. First Embodiment (Erase Mode)

Figure 5:
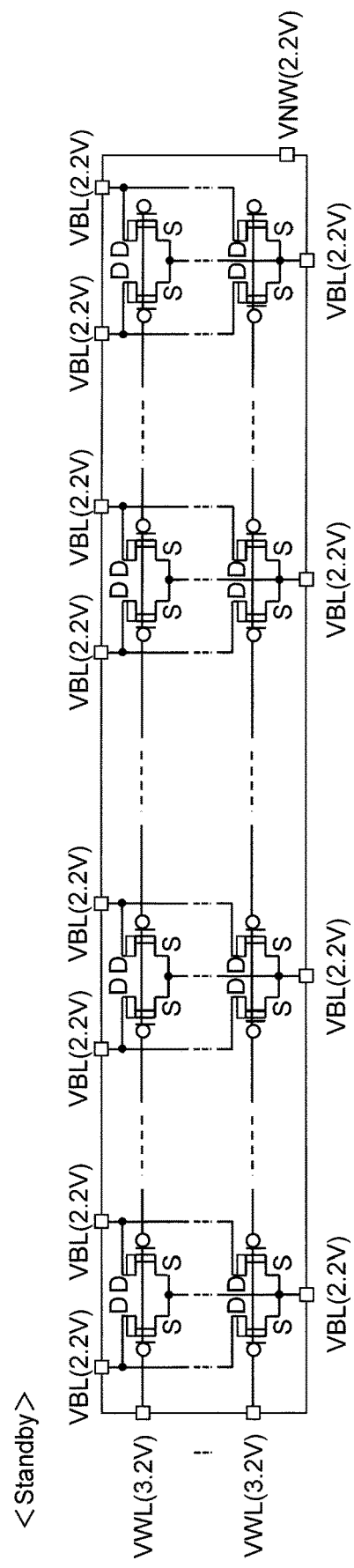
FIG. 5 is a diagram illustrating voltages supplied to the memory cell during an erase standby period of the semiconductor memory device according to the first embodiment.
Figure 6:
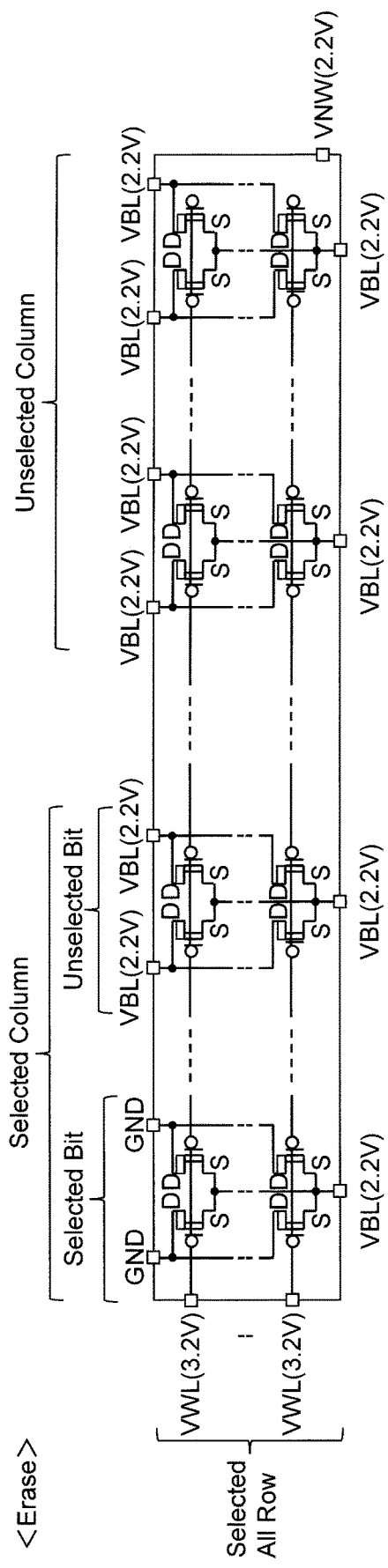
FIG. 6 is a diagram illustrating voltages supplied to the memory cell during an erase operation period of the semiconductor memory device according to the first embodiment.

FIG. 5 is a diagram illustrating voltages supplied to the memory cells during the erase standby period of the semiconductor memory device according to the first embodiment. FIG. 6 is a diagram showing voltages supplied to memory cells during an erase operation period following the erase standby period of the semiconductor memory device according to the first embodiment.

The erase operation is performed collectively for the memory cells of all the rows of Selected Bit column. Before the erase mode, write "1" to the memory cell in which "0" is written and write "0" to the memory cell in which "1" is written in advance. In a memory cell in which nothing is written, write both "0" and "1". As a result, the effective threshold values of the left and right transistors of all memory cells are shifted to negative. This operation is called a pre-program.

As shown in FIG. 5, during the erase standby period, the voltage supply circuit (the word line driving circuit 220, the column switch 230, the sense amplifier circuit 240, the source line driving circuit 260, and the well driving circuit) supplies VBL (2.2V) to all the bit line pairs, VWL (3.2V) to all the word lines WL, VBL (2.2V) to all the source lines SL, and VNW (2.2V) to the n-type well.

As shown in FIG. 6, during the erase operation period, the voltage supply circuit supplies GND (0V) to BLN and BLT connected to the selected memory cells and continues to supply VBL (2.2V) to all bit line pairs connected to the unselected memory cells. The voltage supply circuit continues to supply VWL (3.2V) to all the word lines WL. The voltage supply circuit continues to supply VBL (2.2V) to all the source lines SL. The voltage supply circuit continues to supply VNW (2.2V) to the n-type well.

A following operation is performed by applying the voltage shown in FIG. 6. In the left and right transistors of the selected memory cell, VWL (3.2V) is applied to the gate and GND (0V) is supplied to the bit line pair BLN, BLT, so that avalanche hot electrons are generated at the Schottky barrier junction. The avalanche hot electrons are trapped in the sidewalls of the transistor by VWL (3.2V) applied to gate and neutralize the trapped holes during programming. Consequently, the effective threshold voltage of the transistor is shifted to positive (for example, −0.5V).

On the other hand, in the unselected memory cell, since VBL (2.2V) is supplied to the bit line pair BLN, BLT, the holes trapped in the sidewall of the transistor are not neutralized. As a result, the effective threshold voltage of the transistor is not shifted.

As described above, only the effective threshold voltage of the left and right transistors of the selected memory cell can be shifted to positive. The erase operation may be performed not only on Selected Bit but also on entire Selected Column at once.

2-2-3. First Embodiment (Read Mode)

Figure 7:
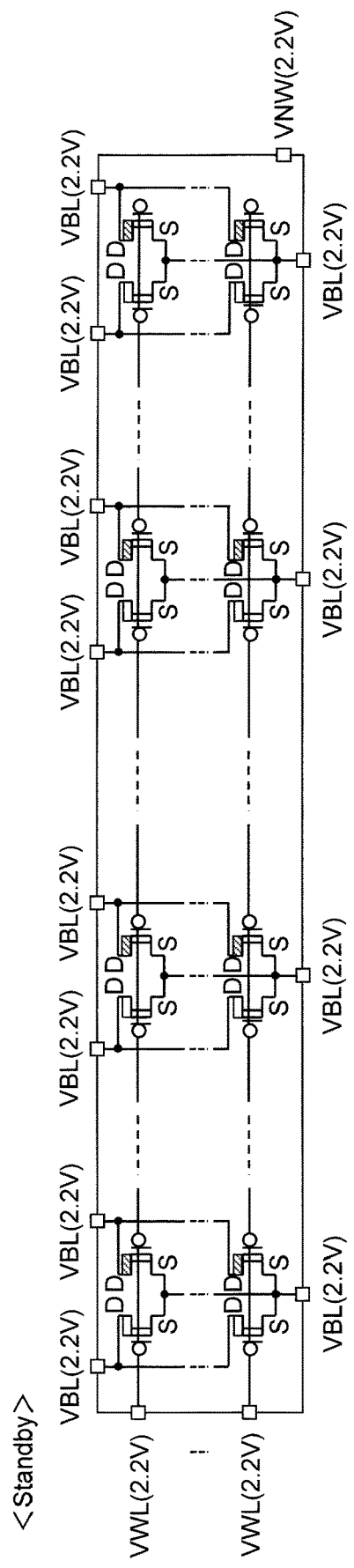
FIG. 7 is a diagram illustrating voltages supplied to the memory cell during a read standby period of the semiconductor memory device according to the first embodiment.
Figure 8:
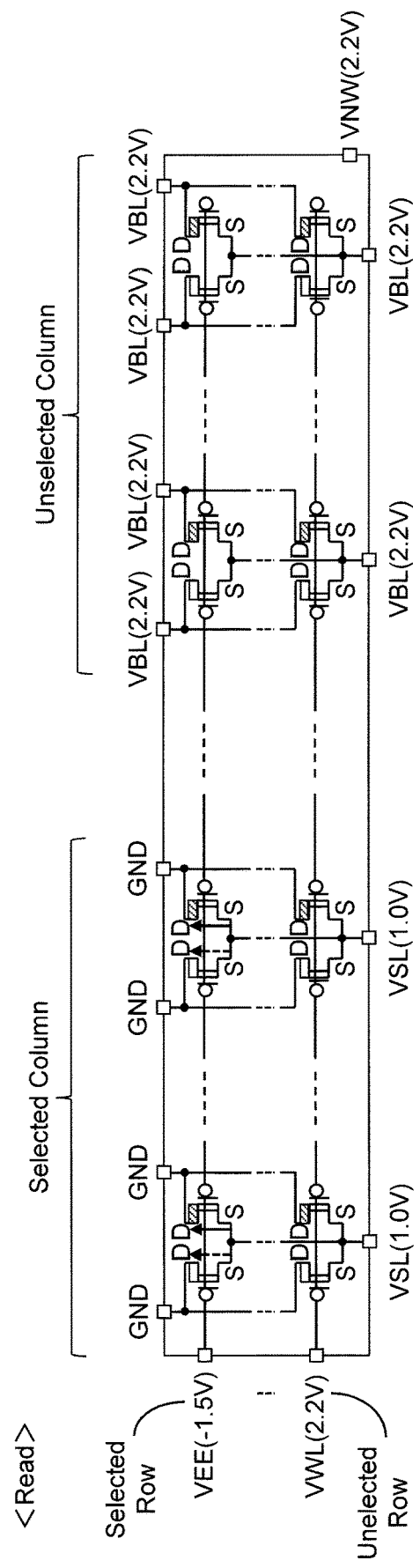
FIG. 8 is a diagram illustrating voltages supplied to the memory cell during a read operation period of the semiconductor memory device according to the first embodiment.
Figure 9A:
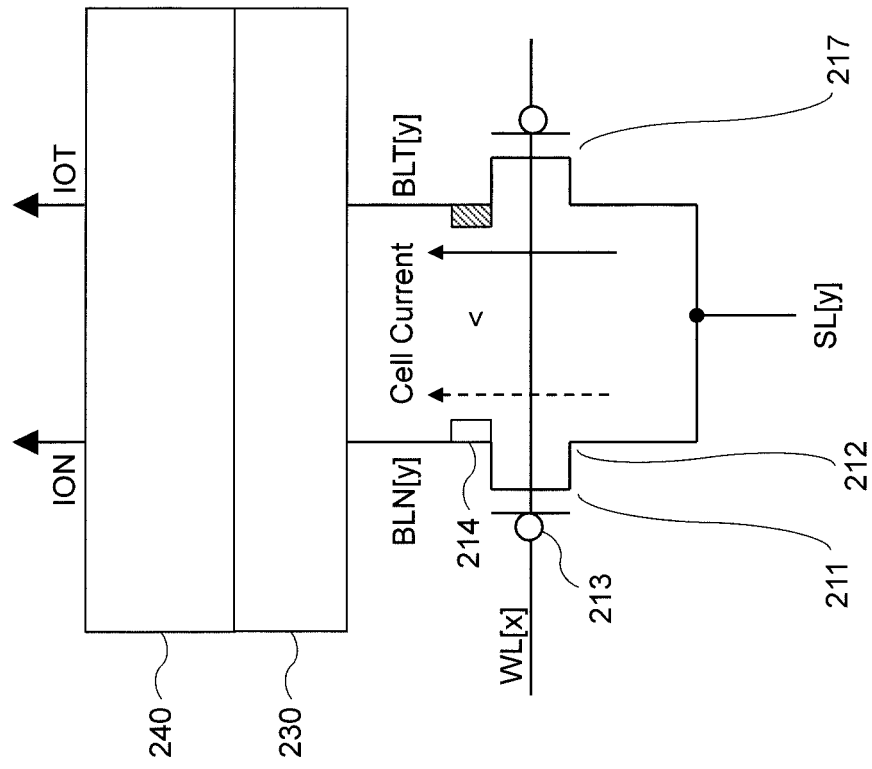
FIG. 9A is a diagram illustrating a difference in the current flowing through the memory cell during the read operation period of the semiconductor memory device according to the first embodiment.

FIG. 7 is a diagram illustrating voltages supplied to the memory cells during a read standby period of the semiconductor memory device according to the first embodiment. FIG. 8 is a diagram showing voltages supplied to the memory cells during a read operation period following the read standby period of the semiconductor memory device according to the first embodiment. FIG. 9A shows the current flowing in the bit line pair BLN, BLT during the read operation, and FIG. 9B shows a variation of the voltages at each node.

As shown in FIG. 7, during the read standby period, the voltage supply circuit (the word line driving circuit 220, the column switch 230, the sense amplifier circuit 240, the source line driving circuit 260, and the well driving circuit) supplies VBL (2.2V) to all the bit line pairs, VWL (2.2V) to all the word lines WL, VBL (2.2V) to all the source lines SL, and VNW (2.2V) to the n-type well.

As shown in FIG. 8, during the read operation period, the voltage supply circuit supplies GND (0V) to BLN and BLT connected to memory cells of the Selected Column and VBL (2.2V) to all the bit line pairs connected to the unselected memory cells. The voltage supply circuit supplies a word line WL corresponding to the selected row with VEE (−1.5V) and continues to supply another unselected word line WL with VWL (2.2V). The voltage supply circuit supplies VSL (1.0V) to the source lines SL connected to the memory cells of the Selected Column and continues to supply VBL (2.2V) to all other source lines SL. The voltage supply circuit continues to supply VNW (2.2V) to the n-type well.

When BLN and BLT are supplied to the bit line pair, VSL (1.0V) is supplied to the source line SL, and VEE (−1.5V) is supplied to the word line WL, a current corresponding to the threshold value of the transistor flows. When "0" is written to the selected memory cell, the threshold value of the left transistor connected to the bit line BLN is shifted to negative, so that a current smaller than the current flowing through the right transistor connected to the bit line BLT flows through the left transistor. FIG. 9A shows this situation. Conversely, when "1" is written to the selected memory cell, the threshold value of the right transistor connected to the bit line BLT is shifted to negative, so that a current smaller than the current flowing through the right transistor connected to the bit line BLN flows through the left transistor. Since the bit line pair has a constant capacitance, when the voltage gradually increases, the voltage of the bit line through which more current flows increases quickly.

The voltage of each node during the read period is, more specifically, as shown in FIG. 9B. In the time t1, the source line SL changes from VBL (2.2V) to VSL (1.0V). At the same time, the bit line pair BLN/BLT is also GND (0V). Then, the word line WL changes from VWL (2.2V) to VEE (−1.5V). The bit line pair BLN/BLT, in which the discharge of the bit line is stopped at the time t2, is floated. Then, the voltage of the bit-line pair BLN/BLT gradually increases. However, in case where "0" is written, the increase in the voltage of the bit line BLN is slower than the increase in the voltage of the bit line BLT. The sense amplifier starts operating at time t3. The sense amplifier amplifies the difference between the voltages of the bit lines. IOT/ION of the bit line pair amplified by the time t4 is output.

2-3. First Embodiment (Configuration of Peripheral Circuit)

Figure 10:
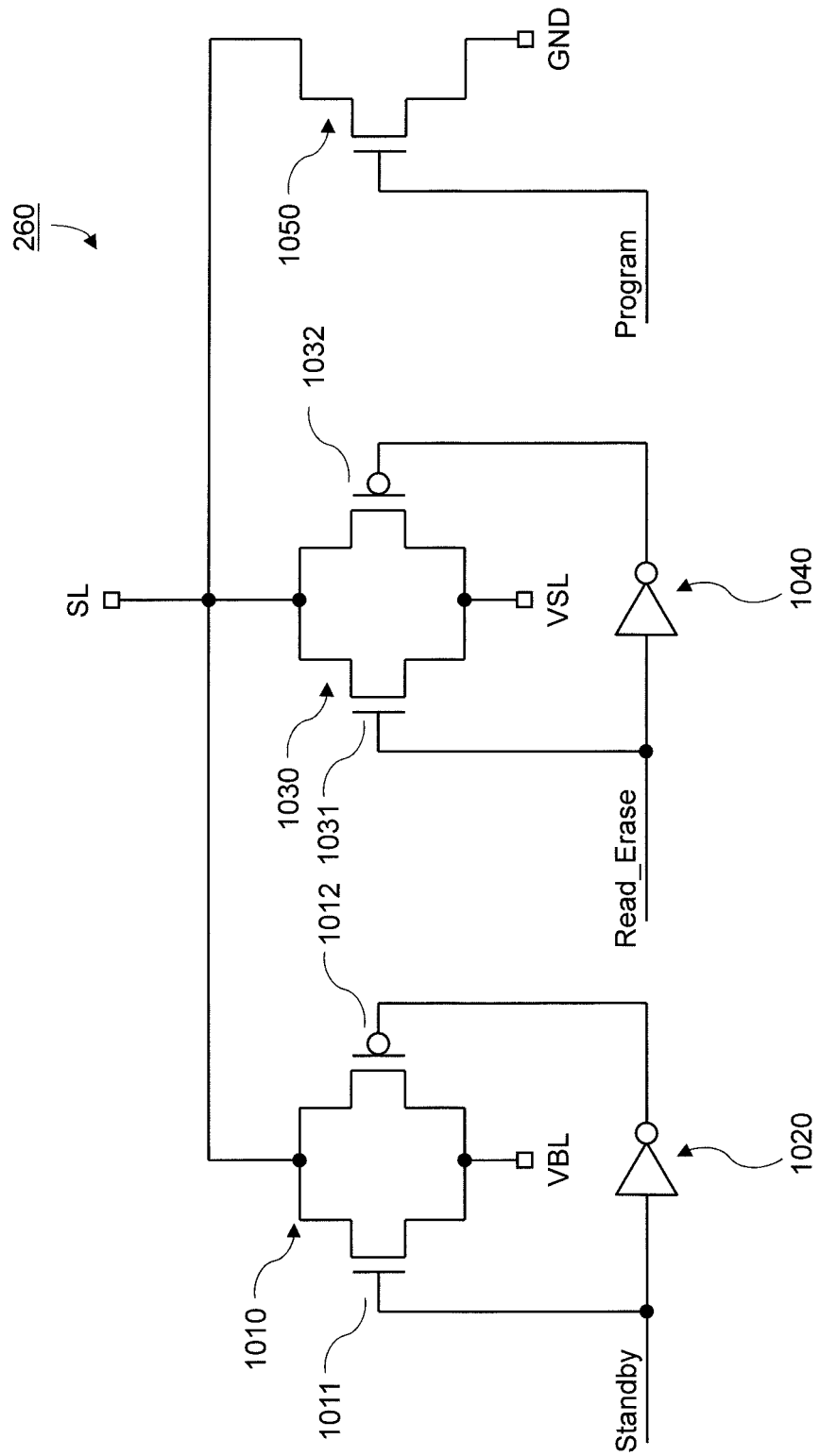
FIG. 10 is a circuit diagram of an element circuit of a source line driving circuit of the semiconductor memory device according to the first embodiment.

FIG. 10 is a circuit diagram of the source line driving circuit 260 of the semiconductor memory device according to the first embodiment. A Standby signal, a Read_Erase signal, and a Program signal are supplied from the control circuit 270.

The source line driving circuit 260 includes a transfer gate 1010, a transfer gate 1030, and an n-type transistor 1050.

The transfer gate 1010 includes an n-type transistor 1011 and a p-type transistor 1012 connected in parallel, and is driven by a complementary signal of a Standby signal generated by an inverter 1020, and supplies the voltage VBL to the source line SL.

The transfer gate 1030 includes an n-type transistor 1031 and a p-type transistor 1032 connected in parallel, and is driven by a complementary signal of a Read_Erase signal generated by an inverter 1040, and supplies a voltage VSL to the source line SL.

The n-type transistor 1050 is driven by a Program signal and supplies GND voltage to the source line SL.

Figure 11:
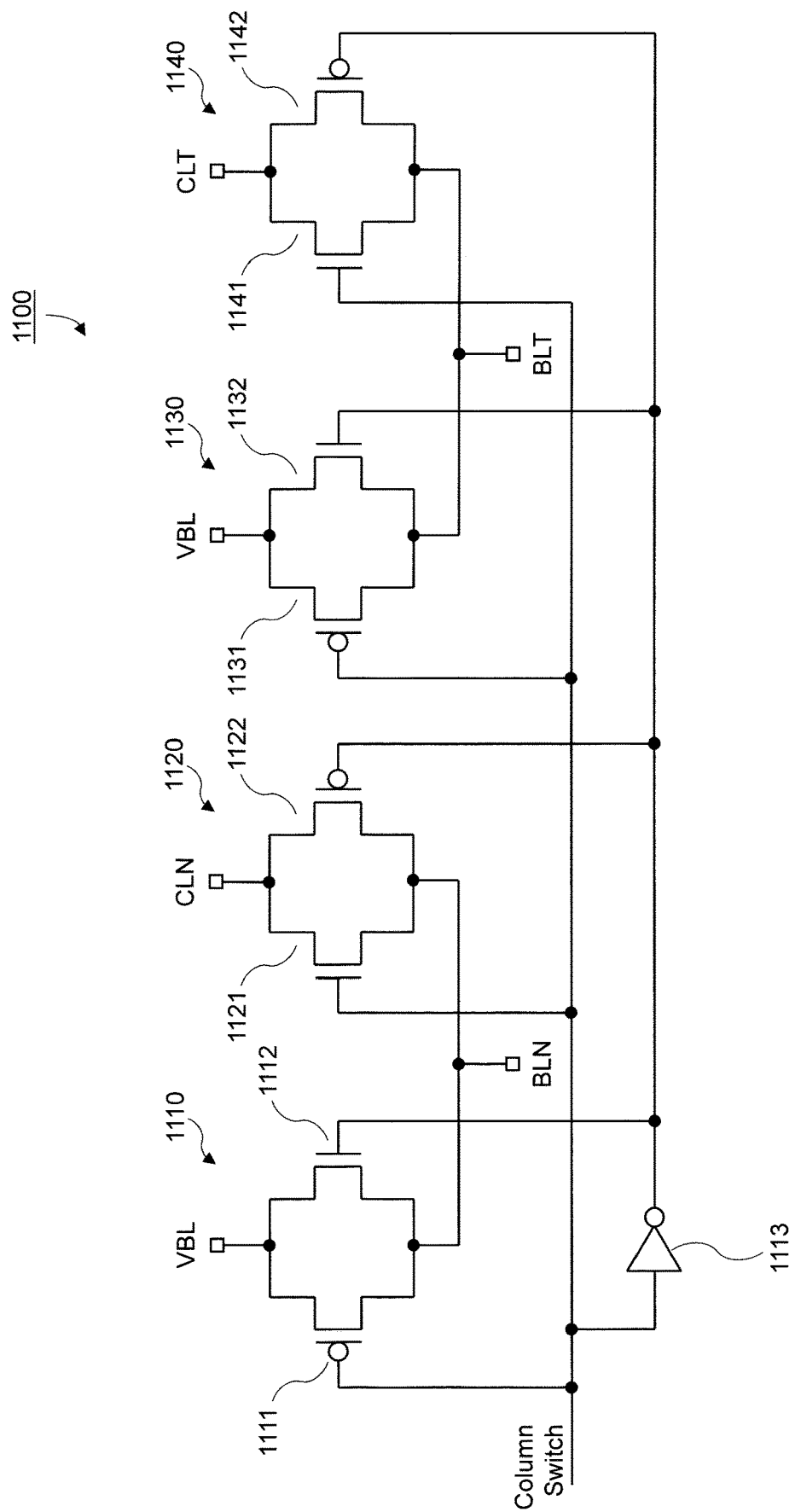
FIG. 11 is a circuit diagram of an element circuit of a column switch of the semiconductor memory device according to the first embodiment.

FIG. 11 is a circuit diagram of a column switch element circuit 1100 included in the column switch 230 of the semiconductor memory device according to the first embodiment. All the bit line pairs BLN/BLT are connected to one of column switch element circuits 1100. A Column Switch signal is supplied from the control circuit 270. The signal may include a signal obtained by decoding a column address. In this case, the element circuit also functions as a column selection circuit.

The column switch element circuit 1100 includes a transfer gate 1110, a transfer gate 1120, a transfer gate 1130, and a transfer gate 1140.

The transfer gate 1110 includes a p-type transistor 1111 and an n-type transistor 1112 connected in parallel, and is driven by a complementary signal of a Column Switch signal generated by an inverter 1113, and supplies the voltage VBL to the bit line BLN.

The transfer gate 1120 includes an n-type transistor 1121 and a p-type transistor 1122 connected in parallel, and is driven by the complementary signal of the Column Switch signal generated by the inverter 1113 to connect the bit line BLN and the node CLN of the sense amplifier 240.

The transfer gate 1130 includes a p-type transistor 1131 and an n-type transistor 1132 connected in parallel, and is driven by the complementary signal of the Column Switch signal generated by the inverter 1113, and supplies a voltage VBL to the bit line BLT.

The transfer gate 1140 includes an n-type transistor 1141 and a p-type transistor 1142 connected in parallel, and is driven by the complementary signal of the Column Switch signal generated by the inverter 1113 to connect the bit line BLT and the node CLT of the sense amplifier 240.

Figure 12:
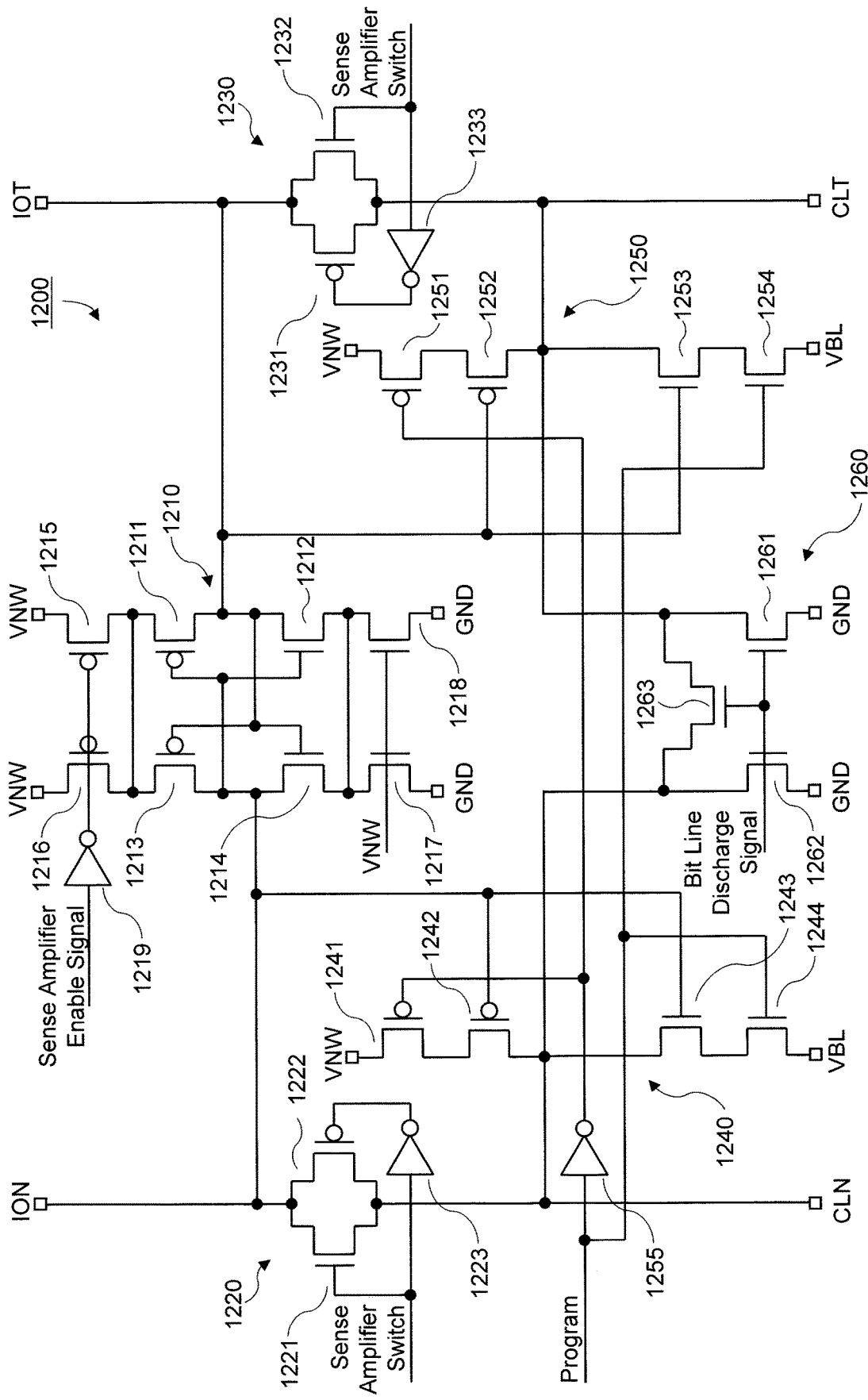
FIG. 12 is a circuit diagram of an element circuit of a sense amplifier circuit of the semiconductor memory device according to the first embodiment.

FIG. 12 is a circuit diagram of a sense amplifier element circuit 1200 included in the sense amplifier circuit 240 of the semiconductor memory device according to the first embodiment. The Program signal, a Sense Amplifier Switch signal, a Sense Amplifier Enable signal, and a Bit Line Discharge signal are supplied from the control circuit 270.

The sense amplifier element circuit 1200 includes an amplifier circuit 1210, a transfer gate 1220, a transfer gate 1230, a bit line voltage supply circuit 1240, a bit line voltage supply circuit 1250, and a bit line discharge circuit 1260.

The amplifier circuit 1210 includes two cross-coupled inverters (a p-type transistor 1211, a n-type transistor 1212 and a p-type transistor 1213, a n-type transistor 1214). A p-type transistor 1215, a p-type transistor 1216, a n-type transistor 1217 and a n-type transistor 1218 supply voltages of VNW and GND to the two inverters according to the complementary signals of a Sense Amplifier Enable signal generated by an inverter 1219.

The transfer gate 1220 includes an n-type transistor 1221 and a p-type transistor 1222 connected in parallel, and is driven by a complementary signal of Sense Amplifier Switch signal generated by an inverter 1223, and connects the node CLN with the node ION and the amplifier circuit 1210.

The transfer gate 1230 includes an n-type transistor 1232 and a p-type transistor 1231 connected in parallel, and is driven by a complementary signal of a Sense Amplifier Switch signal generated by an inverter 1233, and connects the node CLT and the node IOT and the amplifier circuit 1210.

The bit line voltage supply circuit 1240 is a clocked inverter and includes a p-type transistor 1241, a p-type transistor 1242, an n-type transistor 1243, and an n-type transistor 1244 connected in series. The p-type transistor 1241 and the n-type transistor 1244 are conducted by a complementary signal of a Program signal generated by an inverter 1255. The p-type transistor 1242 and the n-type transistor 1243 supply each voltage of VNW or VBL to the nodal CLN in accordance with ION during the write operation.

The bit line voltage supply circuit 1250 is a clocked inverter and includes a p-type transistor 1251, a p-type transistor 1252, an n-type transistor 1253, and an n-type transistor 1254 connected in series. The p-type transistor 1251 and the n-type transistor 1254 are conducted by the complementary signal of the Program signal generated by the inverter 1255. The p-type transistor 1252 and the n-type transistor 1253 supply each voltage of VNW or VBL to the nodal CLT in accordance with IOT during the write operation.

The bit line discharging circuit 1260 includes an n-type transistor 1261, an n-type transistor 1262, and an n-type transistor 1263, and supplies the GND voltage to the node CLN and the node CLT in response to the Bit Line Discharge signal.

Figure 13:
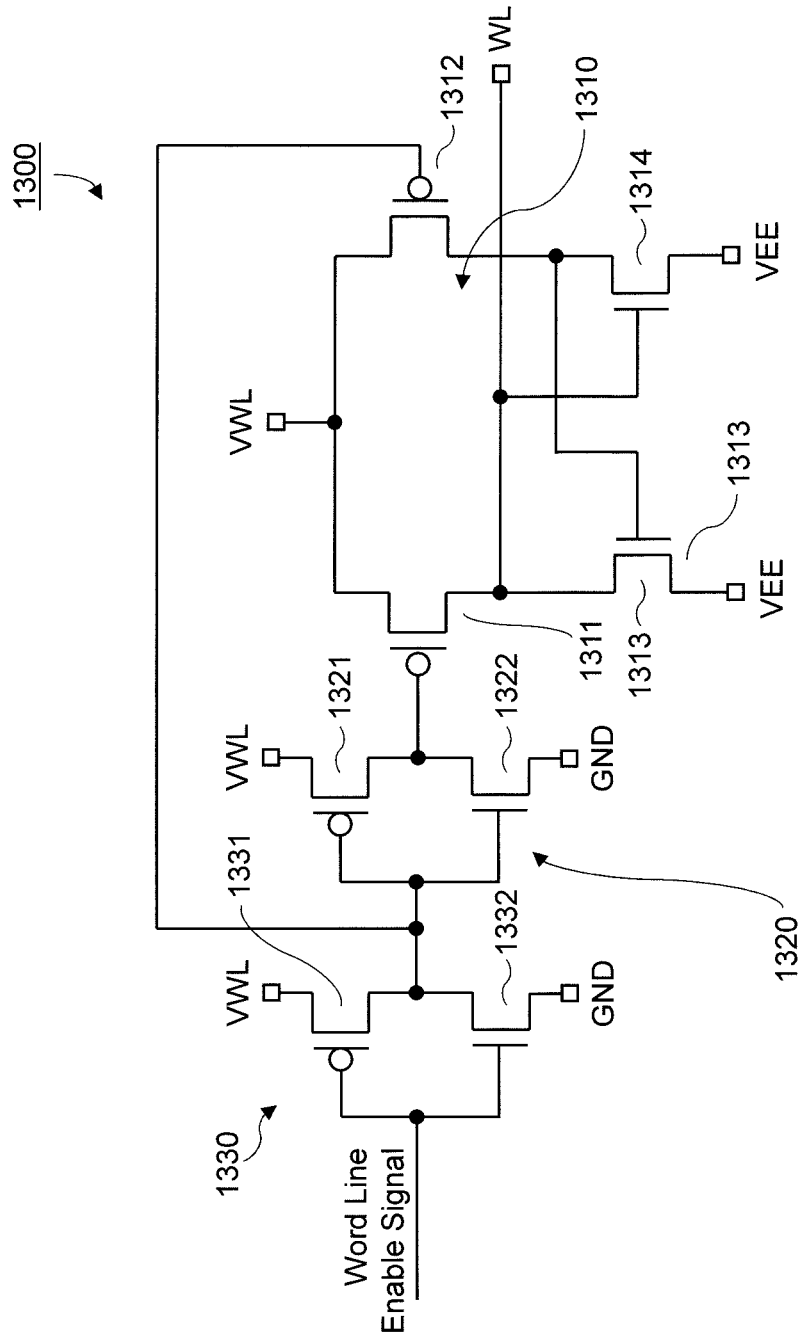
FIG. 13 is a circuit diagram of an element circuit of a word line driving circuit of the semiconductor memory device according to the first embodiment.

FIG. 13 is a circuit diagram of a word line driving circuit element 1300 included in the word line driving circuit 220 of the semiconductor memory device according to the first embodiment. A Word Line Enable signal is supplied from the control circuit 270. The Word Line Enable signal is a signal obtained by decoding a row address.

The word line driving circuit element 1300 includes an inverter 1330 consisting of a p-type transistor 1331 and an n-type transistor 1332, an inverter 1320 consisting of a p-type transistor 1321 and an n-type transistor 1322, and a level shift circuit 1310. The level shift circuit 1310 includes a p-type transistor 1312 driven by the inverter 1330, and two n-type transistors 1313 and 1314 cross-coupled to a p-type transistor 1311 driven by the inverter 1320. The word line driving circuit element 1300 selectively supplies VWL, which is a positive voltage, and VEE, which is a negative voltage, to the word line WL in response to the Word Line Enable signal.

2-4. Effect of First Embodiment

With the above-described configuration, the semiconductor memory device according to the first embodiment can provide a semiconductor memory device with greatly improved reliability while maintaining the features of (1) being able to be manufactured at low cost by using the manufacturing process consistent with the CMOS process of the design rule of the minimum of several tens of nanometers to several nanometers, and (2) being able to hold small to medium sized data from several bits to several megabits in the Nonvolatile.

3-1. Second Embodiment (Circuit Configuration)

Figure 14:
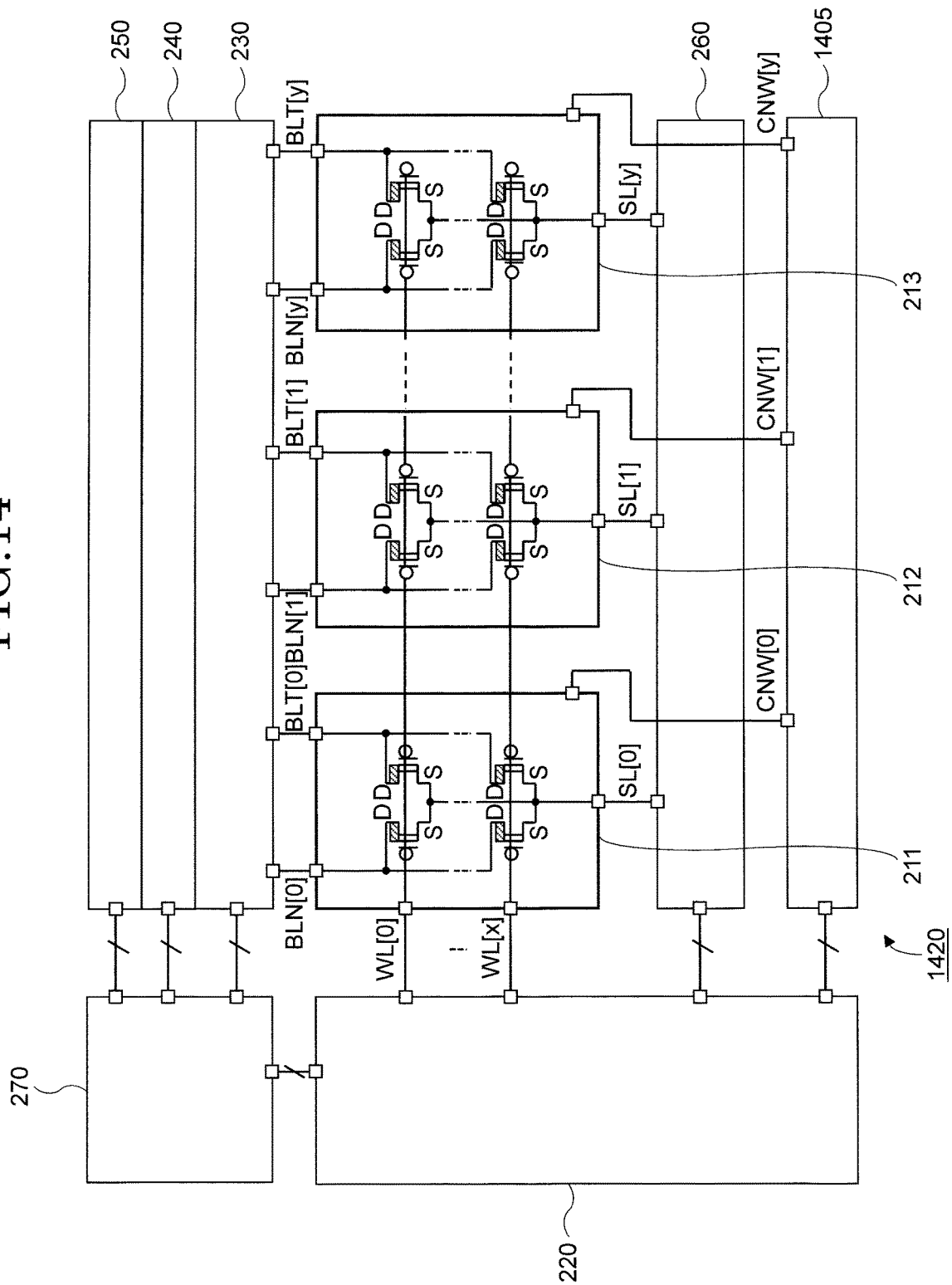
FIG. 14 is a circuit diagram of a semiconductor memory device according to a second embodiment.

FIG. 14 is a circuit diagram of a semiconductor memory device 1420 according to the second embodiment. The semiconductor memory device 1420 includes memory cell subarrays 211, 212, . . . , 213, the word line driving circuit 220, the column switch 230, the sense amplifier circuit 240, the data input/output circuit 250, the source line driving circuit 260, a well voltage driving circuit 1405, and the control circuit 270 in which n-type wells are separated (separated into y+1 wells in FIG. 14) for each column or for each of a plurality of columns (an example in which wells are separated for each column is shown in FIG. 14). The semiconductor memory device 1420 may be provided as a single semiconductor memory device, or may be formed on the same semiconductor substrate together with other logic circuits as in the first embodiment.

As the memory cell subarray 211, a pair of two transistors 170 (the right transistor and the left transistor) described with reference to FIG. 1 is used. The memory cells are arranged in columns in one columns of x+1 rows (0, 1, . . . , x rows).

The same applies to the other y memory cell subarray 212 and 213. The transistors 170 of the memory cell subarrays 211, 212, and 213 are formed in corresponding n-type wells 110 (211, 212, and 213), respectively. Individual n-type wells 110 (211, 212, 213) are driven by n-type well drive voltages CNW[0] to CNW[y] by the well voltage driver 1405. The common source lines of the memory cells in the memory cell subarrays 211, 212, and 213 are individually driven by the source line driving circuit 260.

In the word line driving circuit 220, the column switch 230 and the sense amplifier circuit 240 are the same in the data input/output circuit 250 as in the first embodiment. The control circuit 270 controls the operation of the voltage supply circuit (the word line driving circuit 220, the column switch 230, the sense amplifier circuit 240, the source line driving circuit 260, and the well driving circuit) in each mode of data writing, data erasing, and data reading.

3-2. Second Embodiment (Supply Voltage)

Operations of the semiconductor memory device 1420 according to the second embodiment during the write mode, the erase mode, and the read mode will be described. Table 2 shows each supply voltage in each mode of the second embodiment.

TABLE 2

|  | Write | Erase | Read |
| --- | --- | --- | --- |
| VWL | 2.2 [V] | 3.2 [V] | 2.2 [V] |
| VEE | −5.0 [V] | 0 [V] | −1.5 [V] |
| VBL | 0 [V] | 2.2 [V] | 2.2 [V] |
| VNW | 1.2 [V] | 2.2 [V] | 2.2 [V] |
| VSL | 1.8 [V] | 2.2 [V] | 1.0 [V] |
| VPP | 3.8 [V] | 3.2 [V] | 2.2 [V] |

VSL is supplied to the source lines SL [0] to SL [y]. VPP is mainly supplied to the bit line and the n-type well during writing. In the write mode, the relation of VPP>VWL>VNW>VBL, VSL>0V(GND)>VEE needs to be satisfied. In the erase mode, the relation of VWL>VBL, VNW>VSL>VEE is satisfied. In the read mode, the relation of VWL, VBL, VNW>VSL>0V(GND)>VEE is satisfied.

3-2-1. Second Embodiment (Write Mode)

Figure 15:
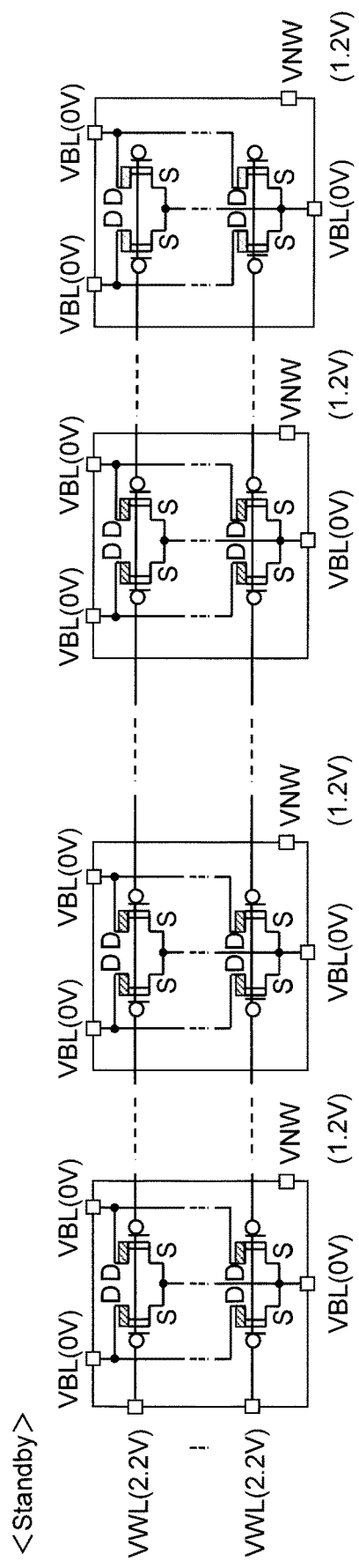
FIG. 15 is a diagram illustrating voltages supplied to the memory cell during a write standby period of the semiconductor memory device according to the second embodiment.
Figure 16:
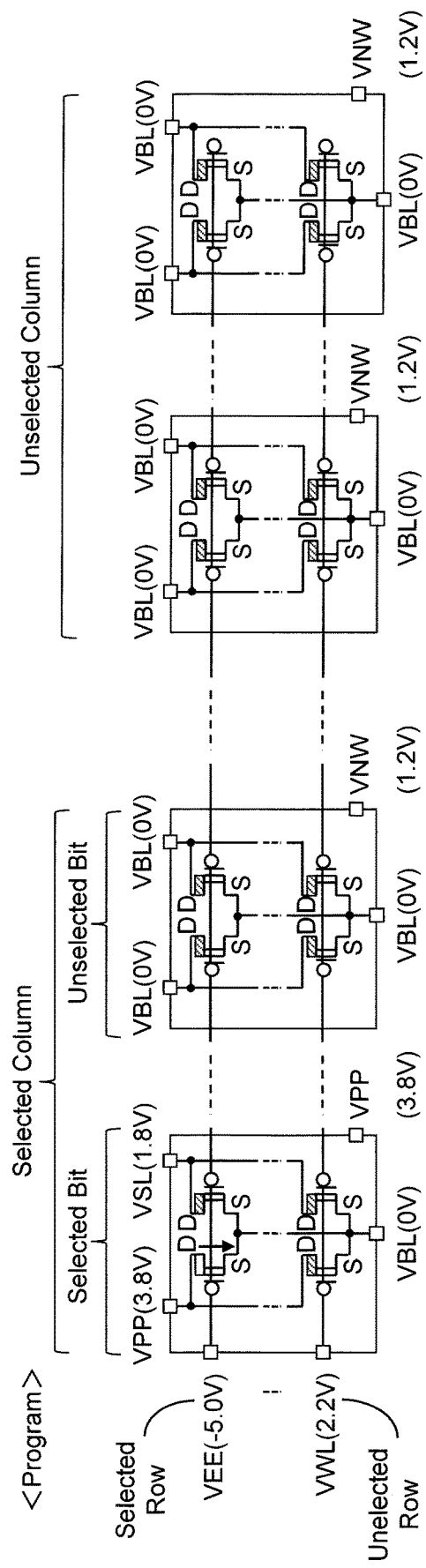
FIG. 16 is a diagram illustrating voltages supplied to the memory cell during a write operation period of the semiconductor memory device according to the second embodiment.

FIG. 15 is a diagram illustrating voltages supplied to the memory cell during the write standby period of the semiconductor memory device according to the second embodiment. FIG. 16 is a diagram showing a voltage supplied to the memory cell during the write operation period following the write standby period of the semiconductor memory device according to the second embodiment. A case where "0" data is written in the selected memory cell is shown as an example.

As shown in FIG. 15, during the write standby period, the voltage supply circuit (the word line driving circuit 220, the column switch 230, the sense amplifier circuit 240, the source line driving circuit 260, and the well voltage driving circuit 1405) supplies VBL (0V) to all the bit line pairs, VWL (2.2V) to all the word lines WL, VBL (0V) to all the source lines SL, and VNW (1.2V) to the n-type well.

As shown in FIG. 16, during the write operation period, the voltage supply circuit supplies VPP (3.8V) to BLN connected to the selected memory cell, and VSL (1.8V) to BLT connected to the selected memory cell, and VBL (0V) to all remaining bit line pairs. The voltage supply circuit provides the selected word line WL with VEE (−5.0V) and the unselected word line WL with VWL (2.2V). The voltage supply circuit continues to supply the source line SL with VBL (0V). The voltage supply circuit continues to supply VPP (3.8V) to the n-type well of the selected memory cell and VNW (1.2V) to the remaining n-type well.

A following operation is performed by applying the voltage shown in FIG. 16. In the left transistor of the selected memory cell (connected to BLN), a VEE (−5.0V) is applied to the gate, so that the channel area immediately below the gate conducts, and the source line SL is supplied with GND (0V) and VNW (3.8V) supplied to the bit line BLN are applied to the Schottky barrier junction. As a result, avalanche hot holes are created at the Schottky barrier junction. This avalanche hot hole is trapped in the sidewall of the transistor by VEE (−5.0V) applied to the gate. This hole shifts the effective threshold voltage of the transistor to negative (for example, −2.0V).

On the other hand, in the right transistor (connected to BLT) of the selected memory cell, the voltage supplied to the bit line BLT is VBL (1.8V), so that an avalanche hot hole is not generated at the Schottky barrier junction. Therefore, the effective threshold voltage of the transistor is not shifted to negative.

In the left and right transistors of the memory cells of the unselected column, the voltage supplied to the bit line pair BLN/BLT is VBL (0V), so that an avalanche hot hole is not generated at the Schottky barrier junction. Therefore, the effective threshold voltage of the transistor is not shifted to negative.

In memory cells of unselected rows, VWL (2.2V) is applied to the gate, so that the channel areas directly below the gate remain non-conducting and no avalanche hot holes are created at the Schottky barrier junction. Therefore, the effective threshold voltage of the transistor is not shifted to negative.

As described above, only the effective threshold voltage of the left transistor of the selected memory cell can be shifted to negative.

When "1" is written to the selected memory cell, 3.8V is applied to a bit line BLT connected to the right transistor during the write operation. Only the effective threshold voltage of the right transistor of the selected memory cell can be shifted to negative.

Here, when the voltage application state of FIG. 16 and the voltage application state of FIG. 4 are compared, the following can be understood. In FIG. 4, the voltage between the gate/source line is 1.8V+5.0V=6.8V even in the memory cells of the unselected columns. Therefore, it is necessary to secure a breakdown voltage of the transistor, or a limit is imposed on the number of times of writing. On the other hand, in FIG. 16, a voltage between gate and source is only 0V+5.0V=5.0V in the memory cells of the unselected columns. Therefore, the breakdown voltage of the transistor may be lower than that of the first embodiment, and the number of times of writing is not limited.

Further, in FIG. 16, the potential of the bit line pair of the memory cell not to be written is 0V, and the n-type well voltage is 1.2V. As a result, avalanche hot holes are less likely to be generated and are less likely to be trapped in the sidewall of the transistor than in a condition of FIG. 4. That is, a write disturb resistance is also improved.

3-2-2. Second Embodiment (Erase Mode)

Figure 17:
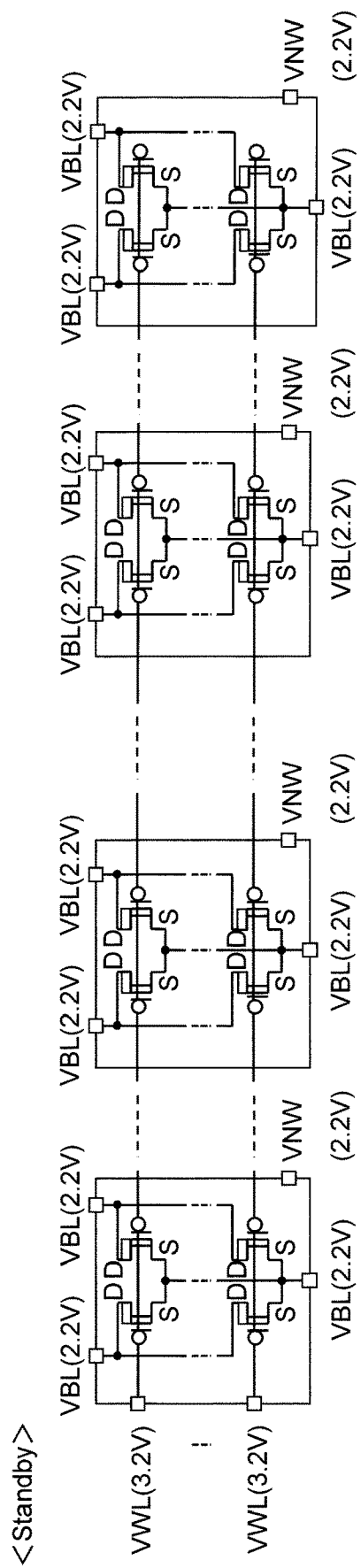
FIG. 17 is a diagram illustrating voltages supplied to the memory cell during an erase standby period of the semiconductor memory device according to the second embodiment.
Figure 18:
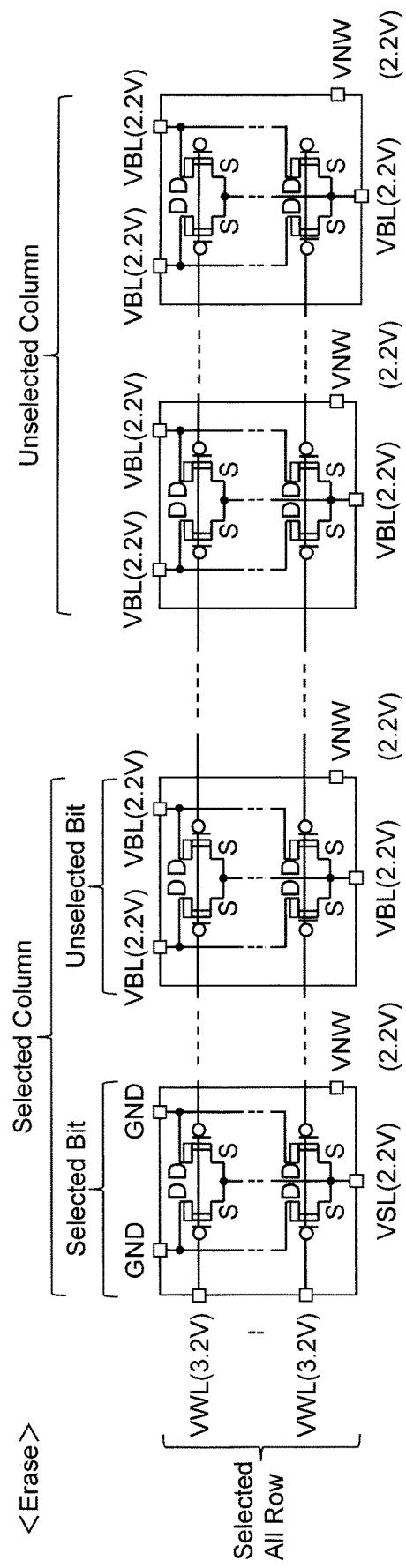
FIG. 18 is a diagram illustrating voltages supplied to the memory cell during an erase operation period of the semiconductor memory device according to the second embodiment.

FIG. 17 is a diagram illustrating voltages supplied to the memory cell during the erase standby period of the semiconductor memory device according to the second embodiment. FIG. 18 is a diagram showing voltages supplied to the memory cell during an erase operation period following the erase standby period of the semiconductor memory device according to the second embodiment.

The erase operation is performed collectively for the memory cells of all the rows of Selected Bit column. It is desirable that the pre-program is performed before the erase mode.

As shown in FIG. 17, during the erase standby period, the voltage supply circuit (the word line driving circuit 220, the column switch 230, the sense amplifier circuit 240, the source line driving circuit 260, and the well voltage driving circuit 1405) supplies VBL (2.2V) to all the bit line pairs, VWL (3.2V) to all the word lines WL), VBL (2.2V) to all the source lines SL, and VNW (2.2V) to the n-type well of the operation.

As shown in FIG. 18, during the erase operation, the voltage supply circuit supplies GND (0V) to BLN and BLT connected to the selected memory cell and continues to supply VBL (2.2V) to all bit line pairs connected to the unselected memory cell. The voltage supply circuit continues to supply VWL (3.2V) to all the word lines WL. The voltage supply circuit continues to supply VBL (2.2V) to all the source lines SL. The voltage supply circuit continues to supply VNW (2.2V) to all n-type wells.

The following operation is performed by applying the voltage shown in FIG. 18. In the left and right transistors of the selected memory cell, VWL (3.2V) is applied to the gate and GND (0V) is supplied to the bit line pair BLN, BLT, so that avalanche hot electrons are generated at the Schottky barrier junction. The avalanche hot electrons are trapped in the sidewalls of the transistor by VWL (3.2V) applied the gate and neutralize the trapped holes during programming. Consequently, the effective threshold voltage of the transistor is shifted to positive (for example, −0.5V).

On the other hand, in the unselected memory cell, the hole trapped in the sidewall of the transistor is not emitted to the bit line pair BLN, BLT because the bit line pair BLN, BLT is supplied with VBL (2.2V). As a result, the effective threshold voltage of the transistor does not shift.

As described above, only the effective threshold voltage of the left and right transistors of the selected memory cell can be shifted to a positive value. The erase operation may be performed not only on Selected Bit but also on the entire Selected Column at once.

3-2-3. Second Embodiment (Read Mode)

Figure 19:
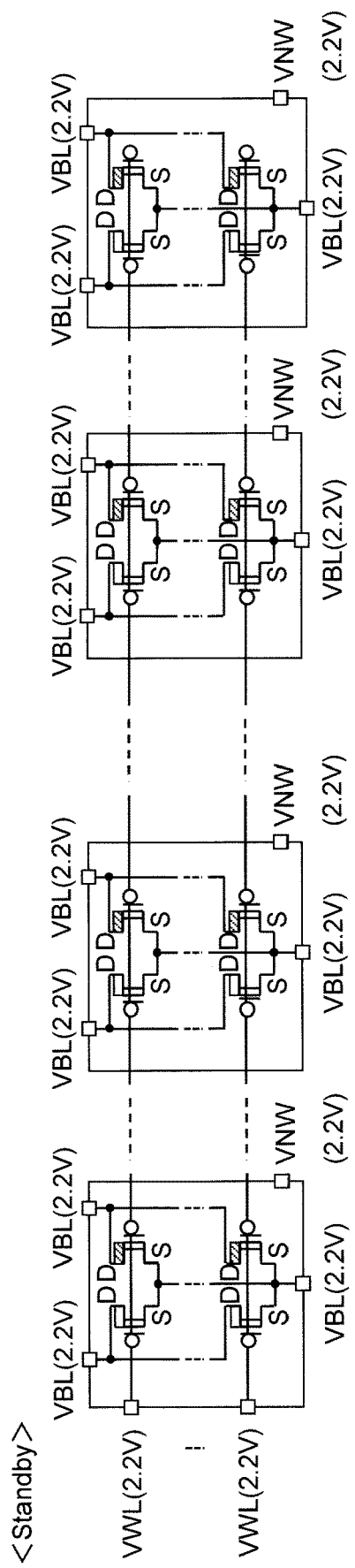
FIG. 19 is a diagram illustrating voltages supplied to the memory cell during a read standby period of the semiconductor memory device according to the second embodiment.
Figure 20:
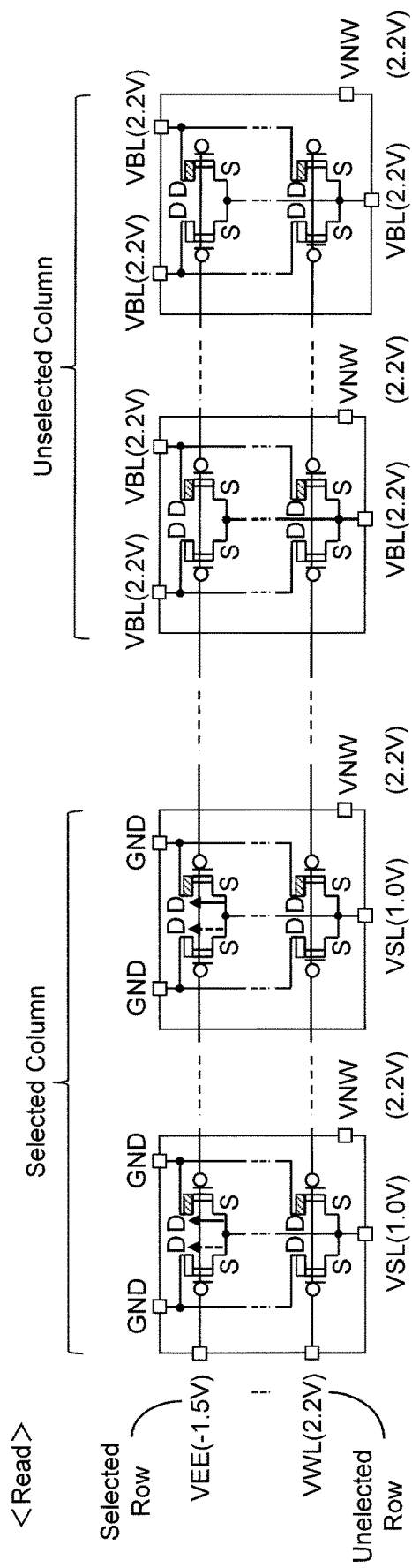
FIG. 20 is a diagram illustrating voltages supplied to the memory cell during a read operation period of the semiconductor memory device according to the second embodiment.

FIG. 19 is a diagram illustrating voltages supplied to the memory cell during the read standby period of the semiconductor memory device according to the second embodiment. FIG. 20 is a diagram illustrating voltages supplied to the memory cell during the read operation period following the read standby period of the semiconductor memory device according to the second embodiment.

As shown in FIG. 19, during the read standby period, the voltage supplying circuit (the word line driving circuit 220, the column switch 230, the sense amplifier circuit 240, the source line driving circuit 260, and the well voltage driving circuit 1405) supplies VBL (2.2V) to all the bit line pairs, VWL (2.2V) to all the word lines WL), VBL (2.2V) to all the source lines SL, and VNW (2.2V) to all the n-type wells.

As shown in FIG. 20, during the read operation, the voltage supply circuit supplies GND (0V) to BLN and BLT connected to Selected Column memory cells and VBL (2.2V) to all the bit line pairs connected to the unselected memory cells. The voltage supply circuit provides VEE (−1.5V) to a word line WL corresponding to the selected row and continues to provide another unselected word line WL with VWL (2.2V). The voltage supply circuit provides VSL (1.0V) to the source lines SL connected to Selected Column memory cells and all other source lines SL with VBL (2.2V). The voltage supply circuit continues to supply VNW (2.2V) to all n-type wells. The mechanism for performing the reading is same as that of the semiconductor memory device according to the first embodiment.

3-3. Second Embodiment (Configuration of Peripheral Circuit)

Figure 21:
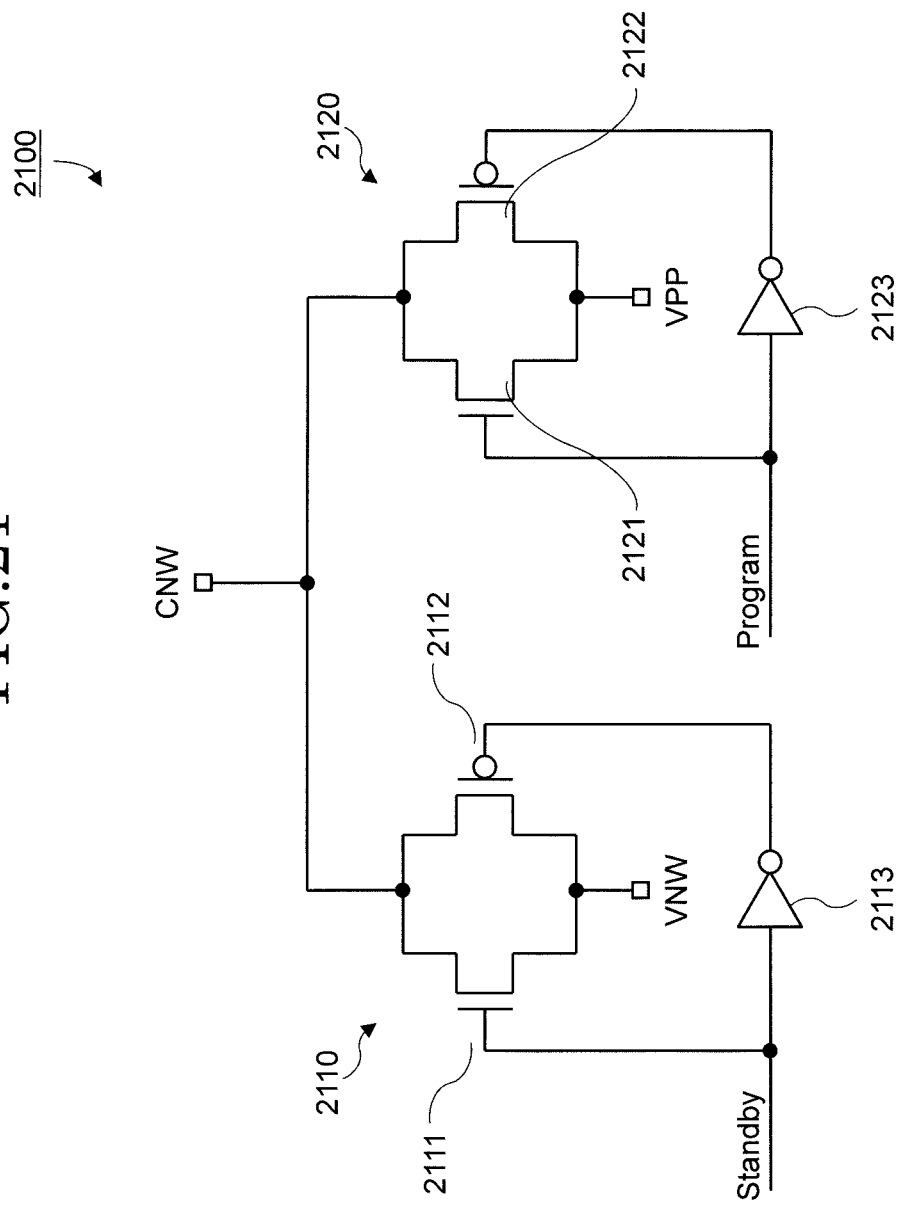
FIG. 21 is a circuit diagram of an element circuit of a well voltage driving circuit of the semiconductor memory device according to the second embodiment.

FIG. 21 is a circuit diagram of a well voltage driving element circuit 2100 included in the well voltage driving circuit 1405 of the semiconductor memory device according to the second embodiment. The Standby signal and the Program signal are supplied from the control circuit 270.

The well voltage driving circuit 1405 includes a transfer gate 2110 and a transfer gate 2120.

The transfer gate 2110 consists of an n-type transistor 2111 and a p-type transistor 2112 connected in parallel, and is driven by a complementary signal of a Standby signal generated by an inverter 2113, and supplies a voltage VNW to the corresponding n-type well CNW[0] to CNW[y].

The transfer gate 2120 includes an n-type transistor 2121 and a p-type transistor 2122 connected in parallel, and is driven by a complementary signal of a Program signal generated by the inverter 2123, and supplies a voltage VPP to the corresponding n-type well CNW[0] to CNW[y].

Figure 22:
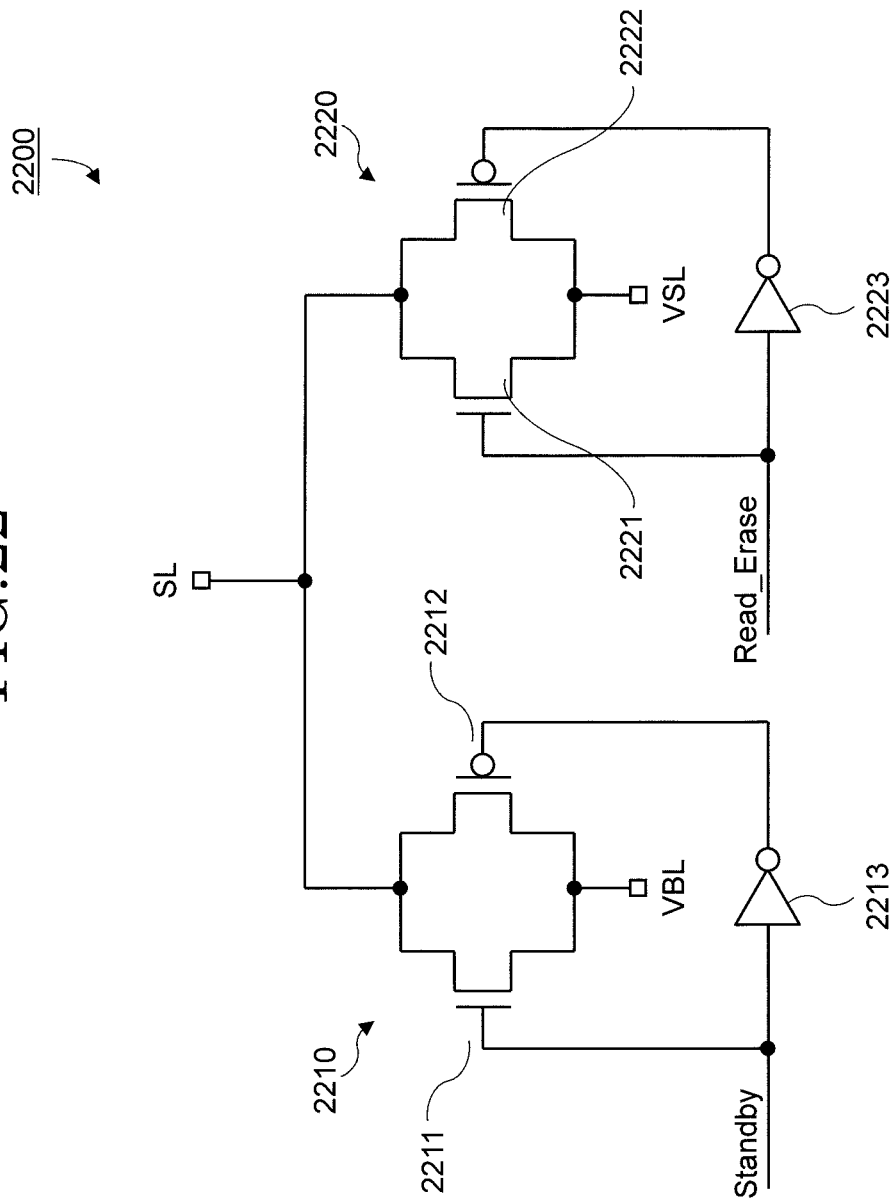
FIG. 22 is a circuit diagram of an element circuit of a column switch of the semiconductor memory device according to the second embodiment.

FIG. 22 is a circuit diagram of the source line driving element circuit 2200 included in the source line driving circuit 260 of the semiconductor memory device according to the second embodiment. The Standby signal, the Read_Erase signal, and the Program signal are supplied from the control circuitry 270.

The source line driving element circuit 2200 includes a transfer gate 2210 and a transfer gate 2220.

The transfer gate 2210 includes an n-type transistor 2211 and a p-type transistor 2212 connected in parallel, and is driven by a complementary signal of a Standby signal generated by an inverter 2213, and supplies the voltage VBL to the source line SL.

The transfer gate 2220 includes an n-type transistor 2221 and a p-type transistor 2222 connected in parallel, and is driven by a complementary signal of a Read_Erase signal generated by the inverter 2223, and supplies the voltage VSL to the source line SL.

3-4. Effect of the Second Embodiment

With the configuration as described above, the semiconductor memory device according to the second embodiment does not need to increase the breakdown voltage of the transistor in addition to the semiconductor device according to the first embodiment, and does not impose any restriction on a number of times of writing. Furthermore, write disturbance can be effectively suppressed. As a result, it is possible to provide a semiconductor memory device with greatly improved reliability.

4-1. Third Embodiment (Circuit Configuration)

Figure 23:
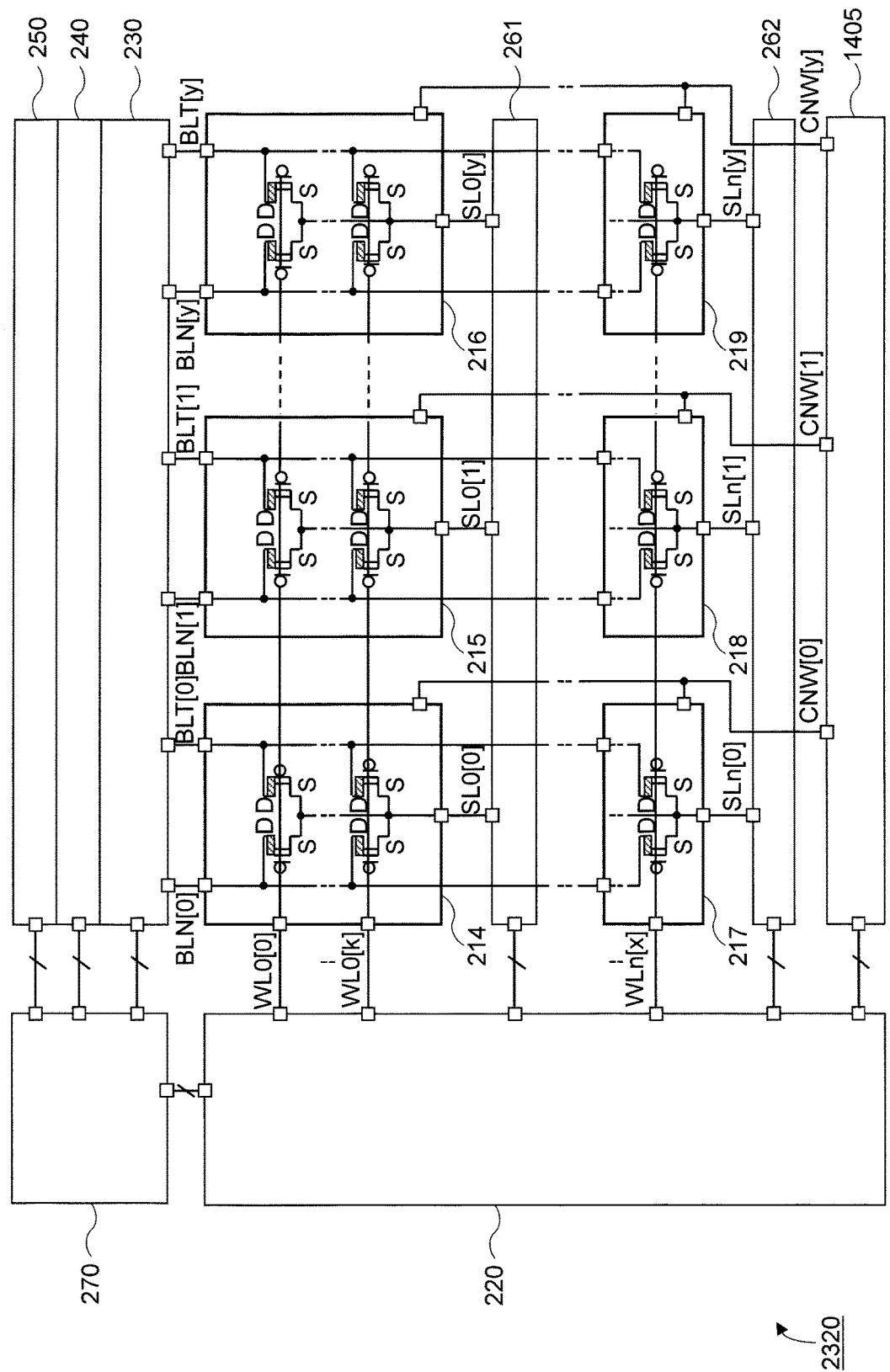
FIG. 23 is a circuit diagram of a semiconductor memory device according to a third embodiment.

FIG. 23 is a circuit diagram of a semiconductor memory device 2320 according to the third embodiment. In the semiconductor memory device 2320, the n-type wells are consisting of memory cell subarrays 214, 215, . . . , 219, the word line driving circuit 220, the column switch 230, the sense amplifier circuit 240, the data input/output circuit 250, source line driving circuits 261, . . . , 262, the well voltage driving circuit 1405, and the control circuit 270 separated in the column direction (separated to y+1 in FIG. 23) for each column or for each of a plurality of columns (FIG. 23 shows an example in which wells are separated column by column) and are separated in the row direction (separated to (x+1)/(k+1) in FIG. 23) for each row or for each of a plurality of rows (FIG. 23 shows an example in which wells are separated by each k+1 row). The semiconductor memory device 1420 may be provided as a single semiconductor memory device, or may be formed on the same semiconductor substrate together with other logic circuits in the same manner as in the first embodiment and the second embodiment.

As the memory cell subarray 214, the pair of two transistors 170 (the right transistor and the left transistor) described with reference to FIG. 1 is used. The memory cells are arranged in columns in one columns of k+1 rows (0, 1, . . . , k rows). The same applies to the other memory cell subarrays 215, 216, 217, . . . , 219 arranged in rows. The transistors 170 of the memory cell subarrays 214, 215, 216, 217, 218, and 219 are respectively formed in the corresponding n-type wells 110 (214, 215, 216, 217, 218, and 219). Individual n-type wells 110 (214, 215, 216, 217, 218, 219) are driven by n-type well drive voltages CNW[0] to CNW[y] by the well voltage driving circuit 1405. The common source lines of the memory cells in the memory cell subarrays 211, 212, and 213 are individually driven for each divided row by the source line driving circuits 261, . . . , 262, respectively.

In the word line driving circuit 220, the column switch 230, the sense amplifier circuit 240, the data input/output circuit 250, and the well voltage driving circuit 1405 are the same as those in the second embodiment. The control circuit 270 controls the operation of the voltage supply circuit (the word line driving circuit 220, the column switch 230, the sense amplifier circuit 240, the source line driving circuits 261 and 262, and the well voltage driving circuit 1405) in each mode of data writing, data erasing, and data reading.

4-2. Third Embodiment (Supply Voltage)

The operations of the semiconductor memory device 1420 according to the third embodiment in the write mode, the erase mode, and the read mode will be described. Table 3 shows each supply voltage in each mode of the third embodiment.

TABLE 3

|     | Write    | Erase   | Read     |
|-----|----------|---------|----------|
| VWL | 2.2 [V]  | 3.2 [V] | 2.2 [V]  |
| VLL | 1.2 [V]  | 0 [V]   | 0 [V]    |
| VEE | -5.0 [V] | 0 [V]   | -1.5 [V] |
| VBL | 0 [V]    | 2.2 [V] | 2.2 [V]  |
| VNW | 1.2 [V]  | 2.2 [V] | 2.2 [V]  |
| VSL | 1.8 [V]  | 2.2 [V] | 1.0 [V]  |
| VPP | 3.8 [V]  | 3.2 [V] | 2.2 [V]  |

VLL is mainly supplied to the unselected word line WL of the row block selected at the time of writing. In the write mode, the relation of VLL>VEE needs to be satisfied. Preferably, the relation of VLL>0V(GND)>VEE needs to be satisfied.

4-2-1. Third Embodiment (Write Mode)

Figure 24:
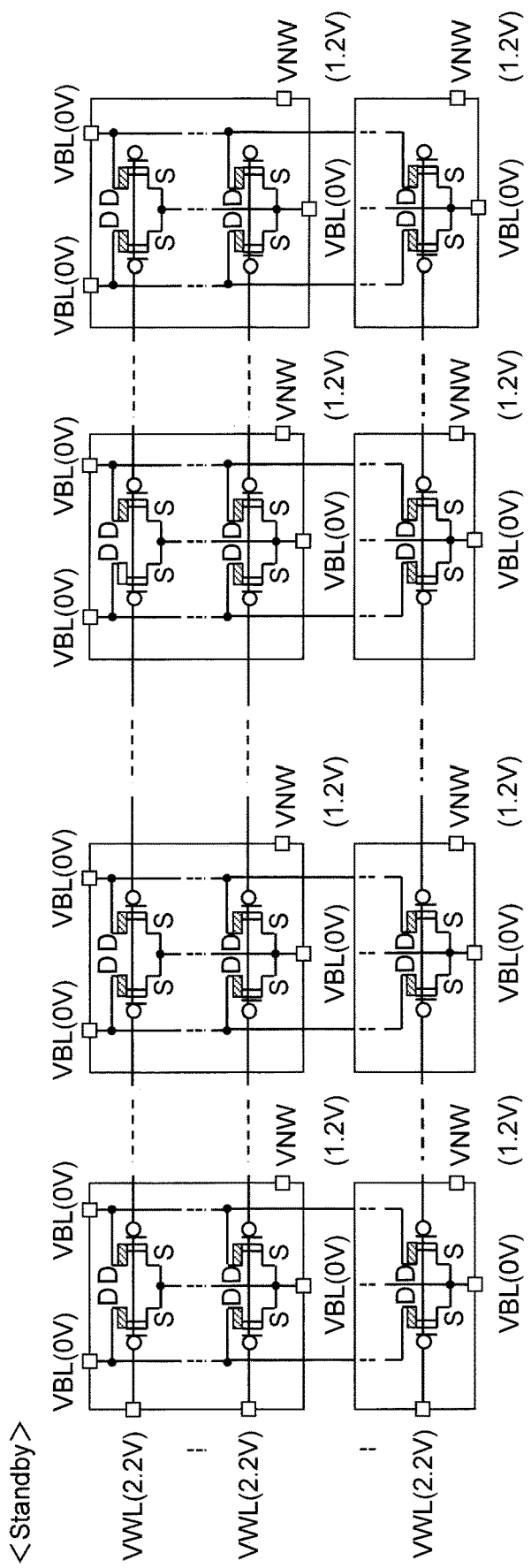
FIG. 24 is a diagram illustrating voltages supplied to a memory cell during a write standby period of the semiconductor memory device according to the third embodiment.
Figure 25:
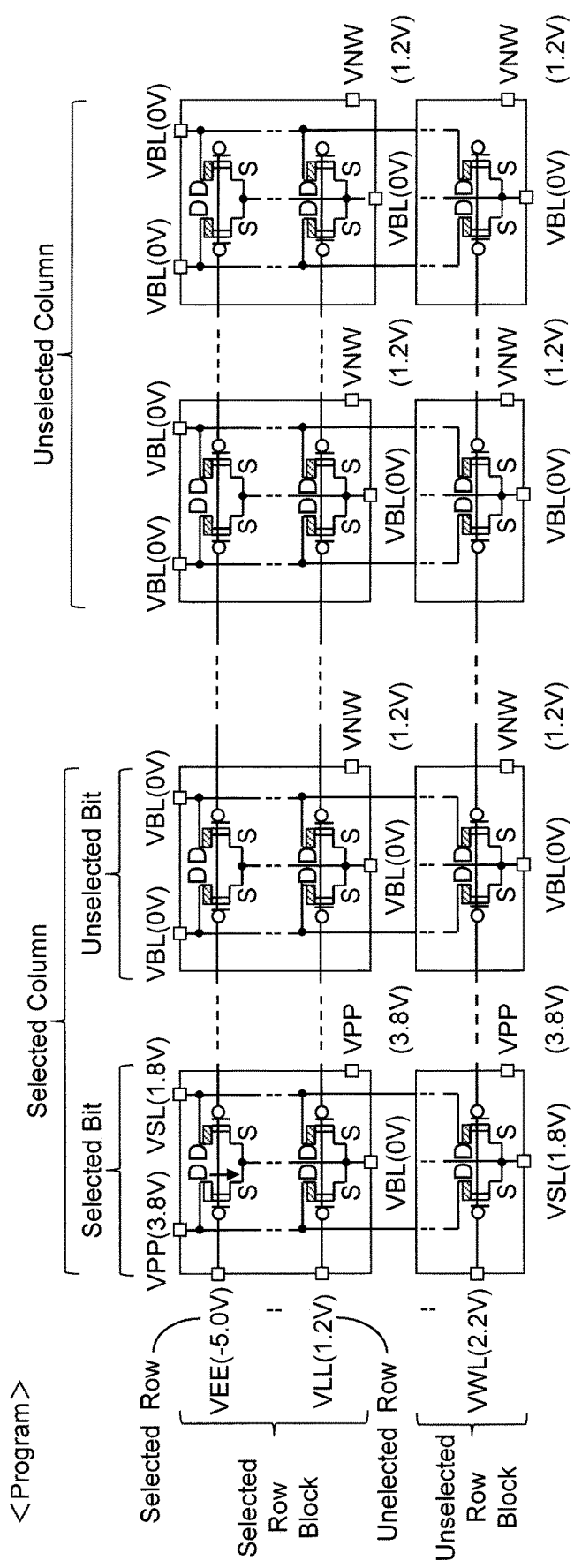
FIG. 25 is a diagram illustrating voltages supplied to the memory cell during a write operation period of the semiconductor memory device according to the third embodiment.

FIG. 24 is a diagram illustrating voltages supplied to the memory cell during a write standby period of the semiconductor memory device according to the third embodiment. FIG. 25 is a diagram showing voltages supplied to the memory cell during a write operation period following a write standby period of the semiconductor memory device according to the third embodiment. A case where "0" data is written in the selected memory cell is shown as an example.

As shown in FIG. 24, during the write standby period, the voltage supply circuit (the word line driving circuit 220, the column switch 230, the sense amplifier circuit 240, the source line driving circuits 261 and 262, and the well voltage driving circuit 1405) supplies VBL (0V) to all the bit line pairs, VWL (2.2V) to all the word lines WL, VBL (0V) to all the source lines SL, and VNW (1.2V) to the n-type well respectively.

As shown in FIG. 25, during the write operation, the voltage supply circuit supplies VPP (3.8V) to BLN connected to the selected memory cell, and VSL (1.8V) to BLT connected to the selected memory cell, and VBL (0V) to all remaining bit line pairs. The voltage supply circuit provides the selected word line WL with VEE (−5.0V) and provides other word lines VLL (1.2V) connected to the memory cells belonging to the selected row block and continues to provide all word lines WL belonging to the unselected row block with VWL (2.2V). The voltage supply circuit continues to supply the source lines SL of the memory cells of the unselected rows connected to the same bit line pair BLN/BLT as the selected memory cells with VSL (1.8V) and VBL (0V) to all other source lines SL. The voltage supply circuit continues to supply VPP (3.8V) to the n-type well of the selected memory cell and VNW (1.2V) to the remaining n-type well.

The following operation is performed by applying the voltage shown in FIG. 25. In the left transistor (connected to BLN) of the selected memory cell, a VEE (−5.0V) is applied to the gate, so that the channel area immediately below the gate conducts, and the source line SL is supplied with GND (0V) and VNW (3.8V) supplied to the bit line BLN are applied to the Schottky barrier junction. As a result, avalanche hot holes are created at the Schottky barrier junction. This avalanche hot hole is trapped in the sidewall of the transistor by VEE (−5.0V) applied to the gate. This hole shifts the effective threshold voltage of the transistor to negative (for example, −2.0V).

On the other hand, in the right transistor (connected to BLT) of the selected memory cell, the voltage supplied to the bit line BLT is VBL (1.8V), so that an avalanche hot hole is not generated at the Schottky barrier junction. Therefore, the effective threshold voltage of the transistor is not shifted to negative.

In the left and right transistors of the memory cells of the unselected column, the voltage supplied to the bit line pair BLN/BLT is VBL (0V), so that an avalanche hot hole is not generated at the Schottky barrier junction. Therefore, the effective threshold voltage of the transistor is not shifted to negative.

In the memory cells of the selected row block, VLL (1.2V) is applied to the gate, so that the channel area immediately below the gate remains non-conducting and no avalanche hot holes are created at the Schottky barrier junction. Therefore, the effective threshold voltage of the transistor is not shifted to negative.

In the memory cells of the unselected row block, VWL (2.2V) is applied to the gate, so that the channel areas directly below the gate remain unrouted and no avalanche hot holes are created at the Schottky barrier junction. Therefore, the effective threshold voltage of the transistor is not shifted to negative. Here, in a memory cell of an unselected row block and belonging to the same column as the selected memory cell (the bit line pair BLN/BLT is shared), the source line SL is supplied with VSL (1.8V).

As described above, only the effective threshold voltage of the left transistor of the selected memory cell can be shifted to negative.

When "1" is written to the selected memory cell, 3.8V is applied to a bit line BLT connected to the right transistor during the write operation. Only the effective threshold voltage of the right transistor of the selected memory cell can be shifted to negative.

Here, when the voltage application state of FIG. 25 and the voltage application state of FIG. 16 are compared, the following can be understood. In FIG. 16, 3.8V is applied between the source/drain of a memory cell in a row other than the row to which the memory cell to be written belongs. As a result, there is a possibility that a leakage current is generated between the source and the drain, and the bit line voltage is not sufficiently increased. On the other hand, in FIG. 25, since the source voltage is VSL (1.8V) for the memory cells in the rows other than the row to which the memory cells to be written belong, the voltage between the source and the drain is 3.8V−1.8V=2.0V. As a result, the leakage current flowing between the source and the drain is reduced, and the possibility of disturbance occurring in the bit line is reduced.

4-2-2. Third Embodiment (Erase Mode)

Figure 26:
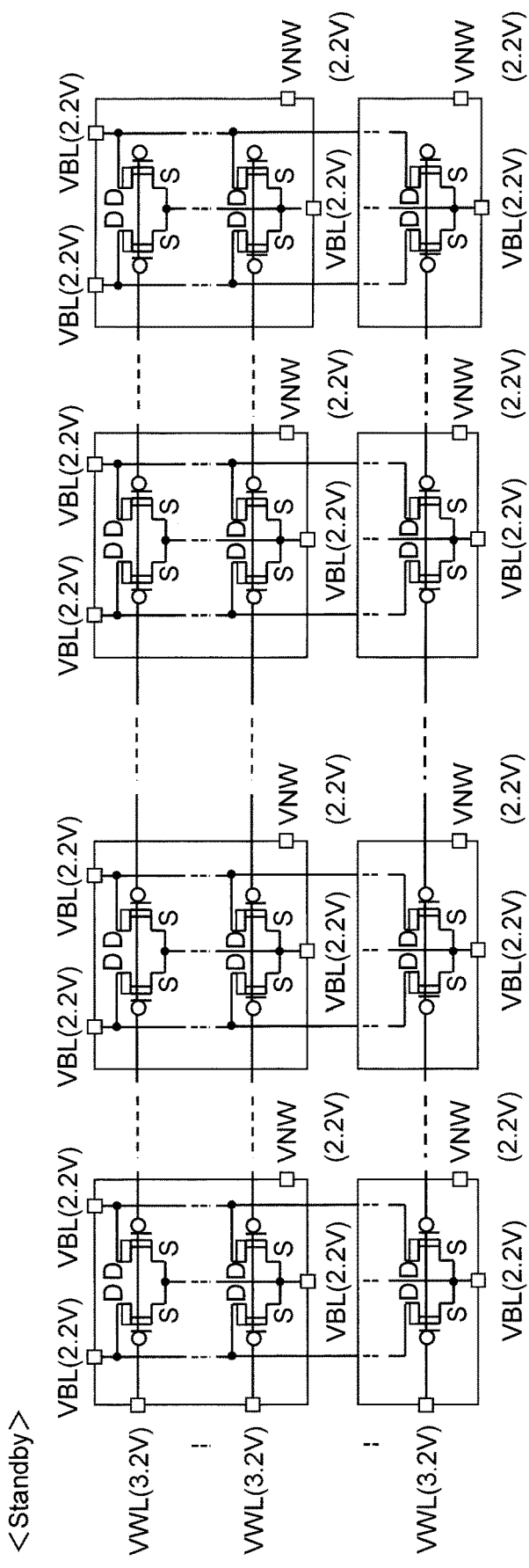
FIG. 26 is a diagram illustrating voltages supplied to the memory cell during an erase standby period of the semiconductor memory device according to the third embodiment.
Figure 27:
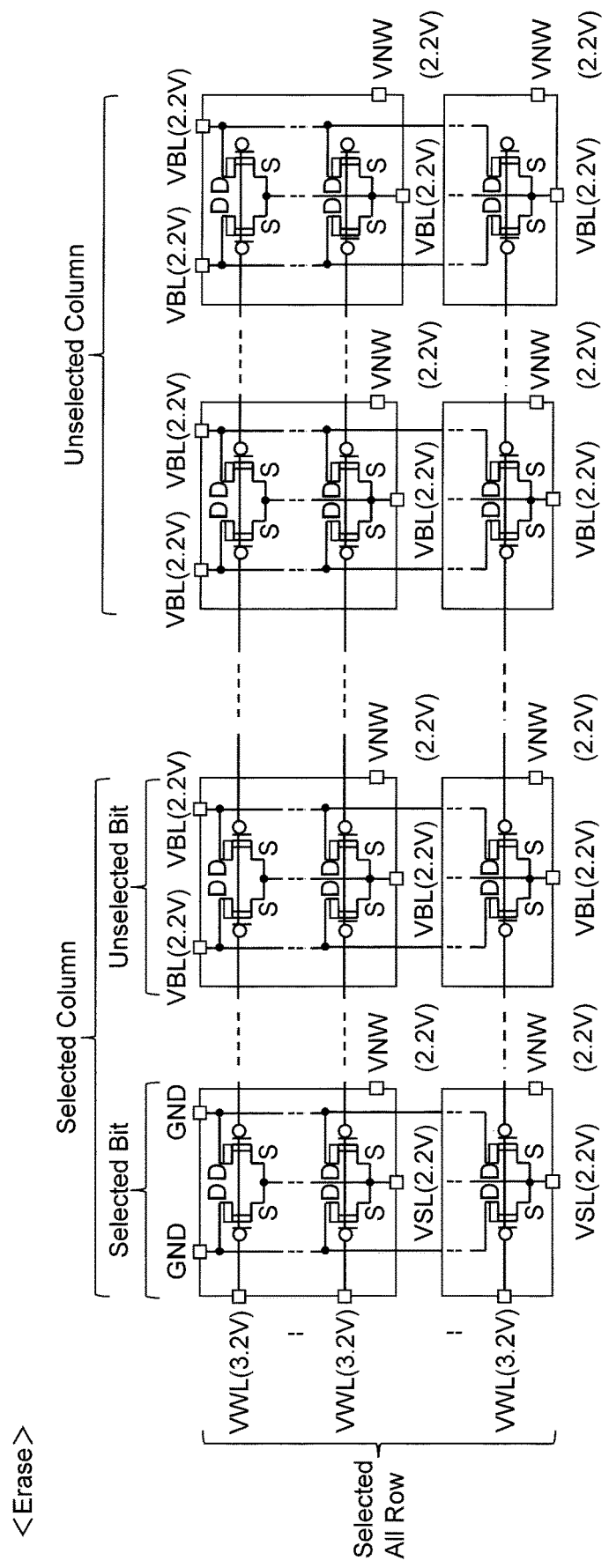
FIG. 27 is a diagram illustrating voltages supplied to the memory cell during an erase operation period of the semiconductor memory device according to the third embodiment.

FIG. 26 is a diagram illustrating voltages supplied to the memory cell during the erase standby period of the semiconductor memory device according to the third embodiment. FIG. 27 is a diagram showing voltages supplied to memory cells during the erase operation period following the erase standby period of the semiconductor memory device according to the third embodiment.

The erase operation is performed collectively for the memory cells of all the rows of Selected Bit column. It is desirable that the pre-program is performed before the erase mode.

As shown in FIG. 26, during the erase standby period, the voltage supply circuit (the word line driving circuit 220, the column switch 230, the sense amplifier circuit 240, the source line driving circuit 260, and the well voltage driving circuit 1405) supplies VBL (2.2V) to all the bit line pairs, VWL (3.2V) to all the word lines WL), VBL (2.2V) to all the source lines SL, and VNW (2.2V) to the n-type well of the operation.

As shown in FIG. 27, during the erase operation, the voltage supply circuit supplies BLN and BLT connected to the selected memory cell (GND (0V)) and continues to supply VBL (2.2V) to all bit line pairs connected to the unselected memory cell. The voltage supply circuit continues to supply VWL (3.2V) to all the word-lines WL. The voltage supply circuit continues to supply VBL (2.2V) to all the source-lines SL. The voltage supply circuit continues to supply VNW (2.2V) to all n-type wells.

The following operation is performed by applying the voltage shown in FIG. 27. In the left and right transistors of the selected memory cell, VWL (3.2V) is applied to the gate and GND (0V) is supplied to the bit line pair BLN, BLT, so that avalanche hot electrons are generated at the Schottky barrier junction. The avalanche hot electrons are trapped in the sidewalls of the transistor by VWL (3.2V) applied to the gate and neutralize the trapped holes during programming. Consequently, the effective threshold voltage of the transistor is shifted to positive (for example, −0.5V).

On the other hand, in the unselected memory cell, the hole trapped in the sidewall of the transistor is not emitted to the bit line pair BLN, BLT because the bit line pair BLN, BLT is supplied with VBL (2.2V). As a result, the effective threshold voltage of the transistor does not shift.

As described above, only the effective threshold voltage of the left and right transistors of the selected memory cell can be shifted to positive. The erase operation may be performed not only on the Selected Bit but also on the entire Selected Column at once.

4-2-3. Third Embodiment (Read Mode)

Figure 28:
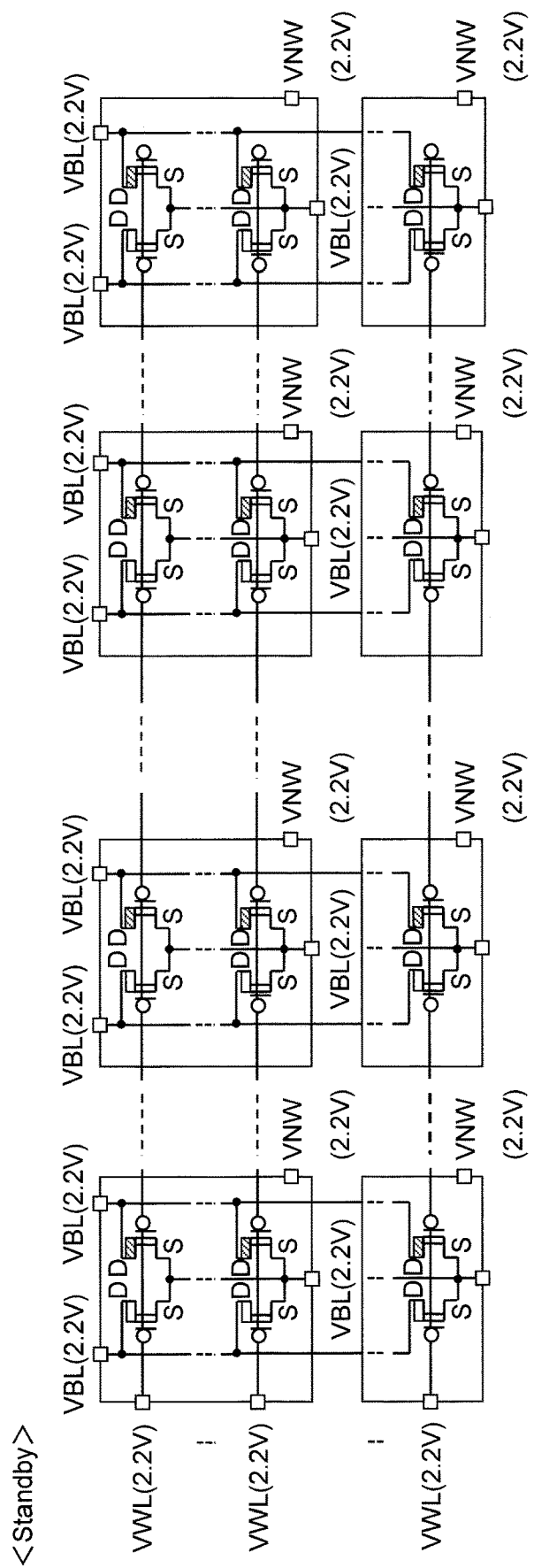
FIG. 28 is a diagram illustrating voltages supplied to the memory cell during a read standby period of the semiconductor memory device according to the third embodiment.
Figure 29:
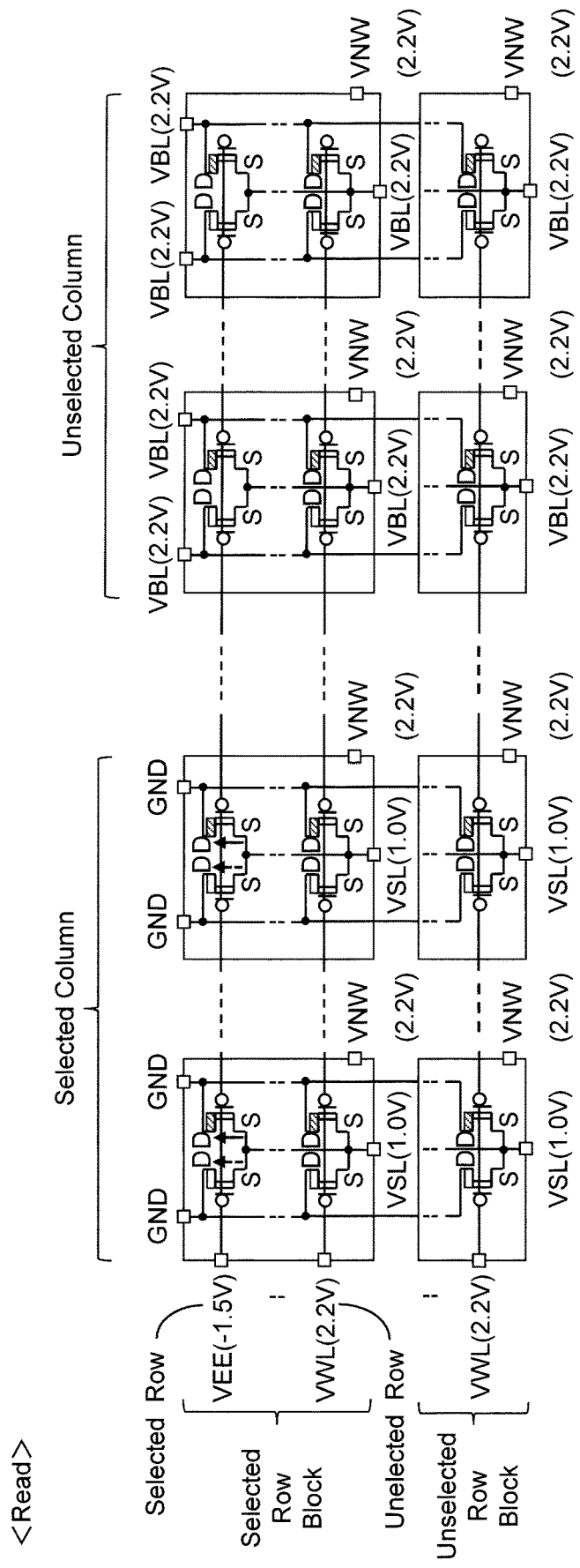
FIG. 29 is a diagram illustrating voltages supplied to the memory cell during a read operation period of the semiconductor memory device according to the third embodiment.

FIG. 28 is a diagram illustrating voltages supplied to the memory cell during the read standby period of the semiconductor memory device according to the third embodiment. FIG. 29 is a diagram showing voltages supplied to the memory cell during the read operation period following the read standby period of the semiconductor memory device according to the second embodiment.

As shown in FIG. 28, during the read standby period, the voltage supplying circuit (the word line driving circuit 220, the column switch 230, the sense amplifier circuit 240, the source line driving circuit 260, and the well voltage driving circuit 1405) supplies VBL (2.2V) to all the bit line pairs, VWL (2.2V) to all the word lines WL), VBL (2.2V) to all the source lines SL, and VNW (2.2V) to all the n-type wells.

As shown in FIG. 29, during the read operation period, the voltage supply circuit supplies GND (0V) to BLN and BLT connected to Selected Column memory cells and VBL (2.2V) to all the bit line pairs connected to the unselected memory cells. The voltage supply circuit provides a word line WL corresponding to the selected row with VEE (−1.5V) and continues to provide another unselected word line WL with VWL (2.2V). The voltage supply circuit provides the source lines SL connected to the Selected Column memory cells with VSL (1.0V) and all other source lines SL with VBL (2.2V). The voltage supply circuit continues to supply VNW (2.2V) to all n-type wells. The mechanism in which the reading is performed is the same as the semiconductor memory device according to the first embodiment and the second embodiment.

4-3. Third Embodiment (Configuration of Peripheral Circuit)

Figure 30:
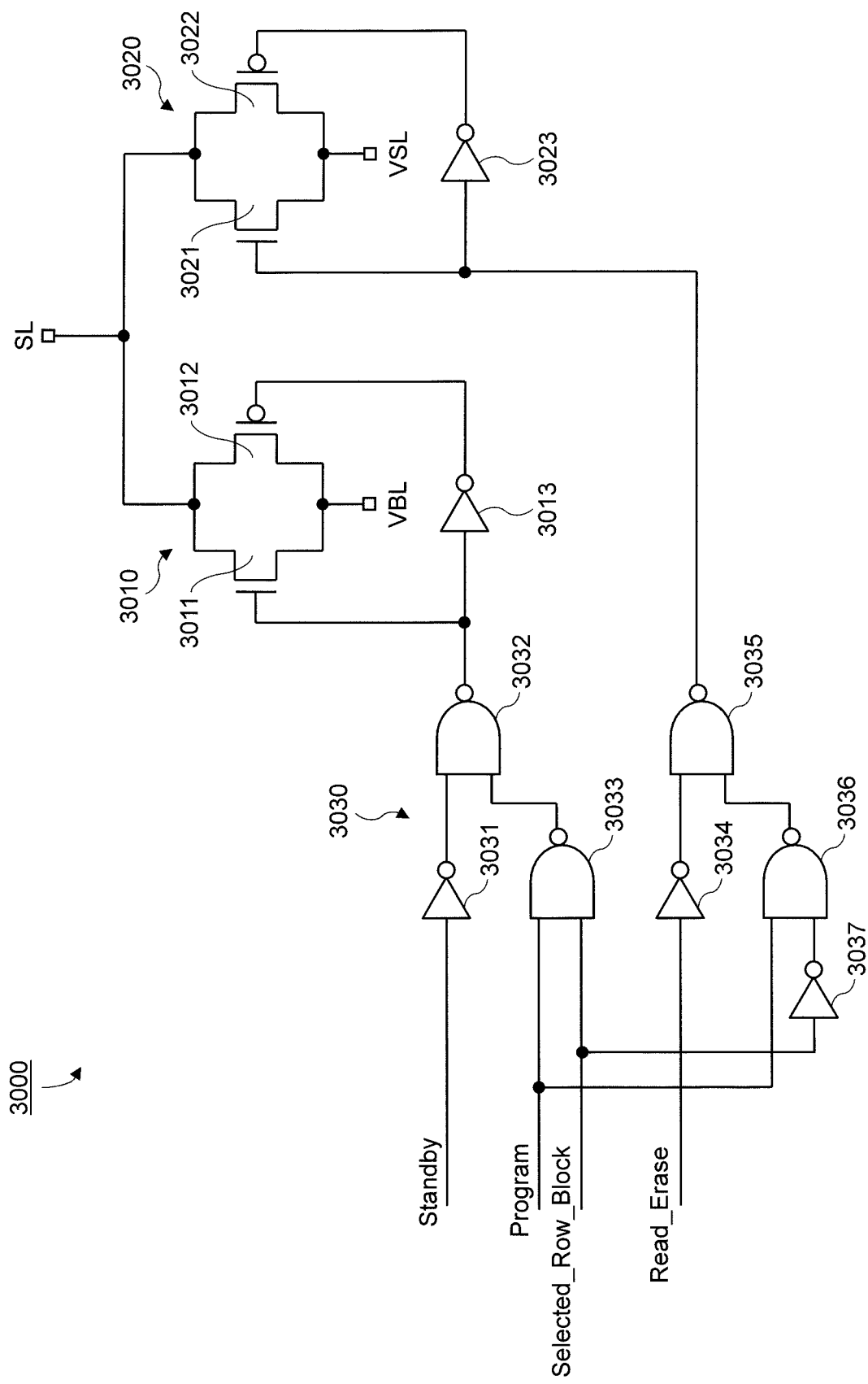
FIG. 30 is a circuit diagram of an element circuit of a source line driving circuit of the semiconductor memory device according to the third embodiment.

FIG. 30 is a circuit diagram of a source line driving element circuit 3000 included in the source line driving circuits 261 and 262 of the semiconductor memory device according to the third embodiment. The Standby signal, a Selected_Row_Block signal, the Read_Erase signal, and the Program signal are supplied from the control circuit 270.

The source line driving element circuit 3000 includes a transfer gate 3010, a transfer gate 3020, and a logic circuit 3030.

The transfer gate 3010 includes an n-type transistor 3011 and a p-type transistor 3012 connected in parallel, and is driven by a complementary signal generated by an inverter 3013 and outputted from the logic circuit 3030, and supplies a voltage VBL to the source line SL The transfer gate 3020 includes an n-type transistor 3021 and a p-type transistor 3022 connected in parallel, and is driven by a complementary signal generated by an inverter 3023 and outputted from the logic circuit 3030, and supplies the voltage VSL to the source line SL.

The logic circuit 3030 includes an inverter 3031, a NAND gate 3032, a NAND gate 3033, an inverter 3034, a NAND gate 3035, a NAND gate 3036, and an inverter 3037, and controls transfer gates 3013 and 3023 so as to supply VSL to the source line SL and VBL to the source line otherwise in the unselected row block during the write operation.

Figure 31:
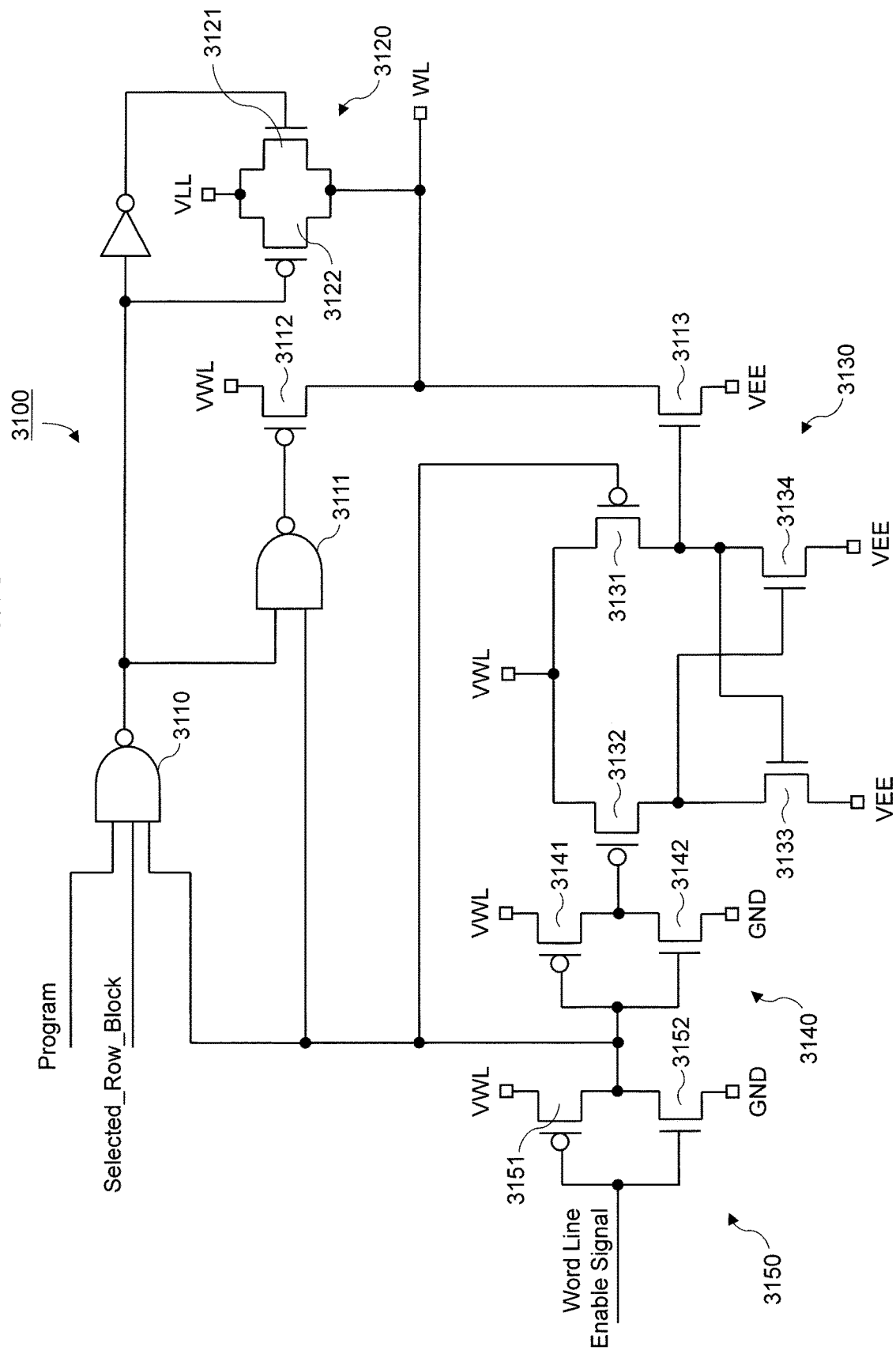
FIG. 31 is a circuit diagram of an element circuit of a word line driving circuit of the semiconductor memory device according to the third embodiment.

FIG. 31 is a circuit diagram of a word line driving circuit element 3100 included in the word line driving circuit 220 of the semiconductor memory device according to the third embodiment. The Word Line Enable signal is supplied from the control circuit 270. The Word Line Enable signal is a signal obtained by decoding the row address.

The word line driving circuit element 3100 includes an inverter 3150 including a p-type transistor 3151 and an n-type transistor 3152, an inverter 3140 including a p-type transistor 3141 and an n-type transistor 3142, a level shift circuit 3130, a transfer gate 3120, and the logic circuit.

The level shift circuit 3130 includes a p-type transistor 3132 driven by the inverter 3140, two n-type transistors 3133 and 3134 cross-coupled to a p-type transistor 3131 driven by the inverter 3150, an n-type transistor 3113 for driving the word line WL to VEE, and a p-type transistor 3112 for driving the word line WL to VWL.

The transfer gate 3120 includes an n-type transistor 3121 and a p-type transistor 3122 connected in parallel, and is driven by a complementary signal of the logic circuit, and supplies the voltage VLL to the word line WL.

The logic circuit (NAND gate 3110 and NAND gate 3111) performs control so that the voltage VLL is supplied to the word line WL only to the word lines belonging to the selected row block and not selected during the write operation.

4-4. Effect of Third Embodiment

With the above-described configuration, the semiconductor memory device according to the third embodiment can effectively suppress write disturbance in addition to the semiconductor device according to the second embodiment. As a result, it is possible to provide a semiconductor memory device with greatly improved reliability.

5-1. Fourth Embodiment (Summary)

Figure 34:
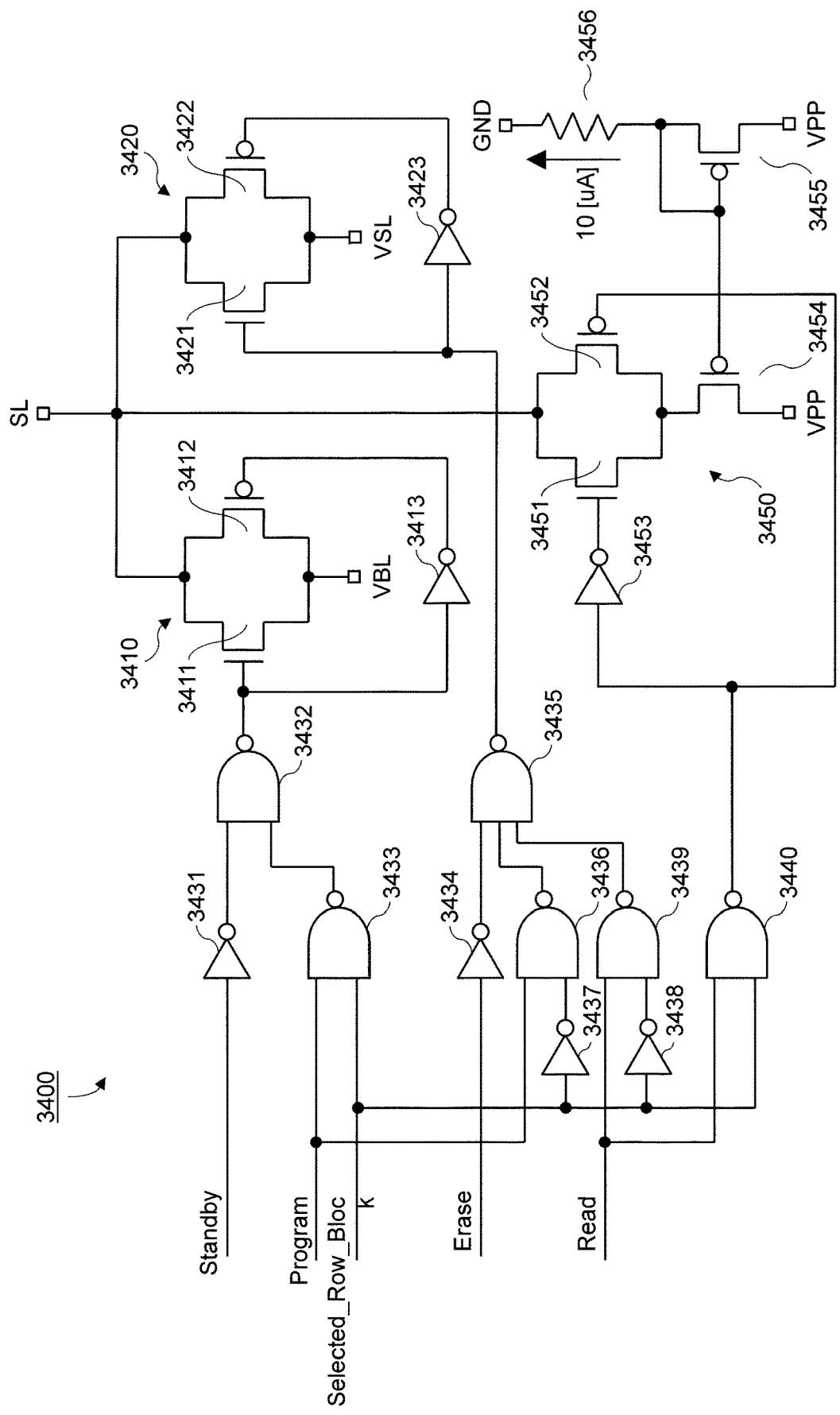
FIG. 34 is a circuit diagram of an element circuit of a source line driving circuit of the semiconductor memory device according to the fourth embodiment.

Hereinafter, the fourth embodiment will be described. In the fourth embodiment, the constant current circuit of FIG. 34 is added to the semiconductor memory device 1420 according to the third embodiment, and the constant current read mode is added thereto. The other circuit configurations and supply voltages are the same as those of the third embodiment.

5-2. Fourth Embodiment (Read Mode)

Figure 32:
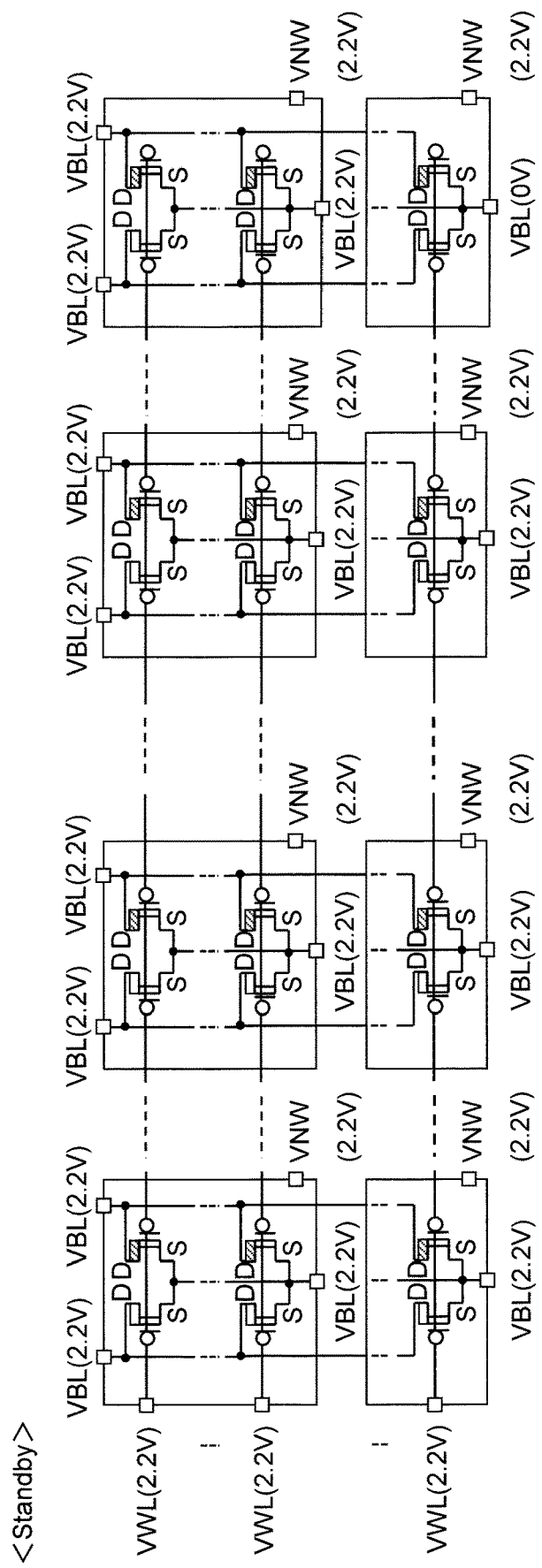
FIG. 32 is a diagram illustrating voltages supplied to the memory cell during a read standby period of the semiconductor memory device according to a fourth embodiment.
Figure 33:
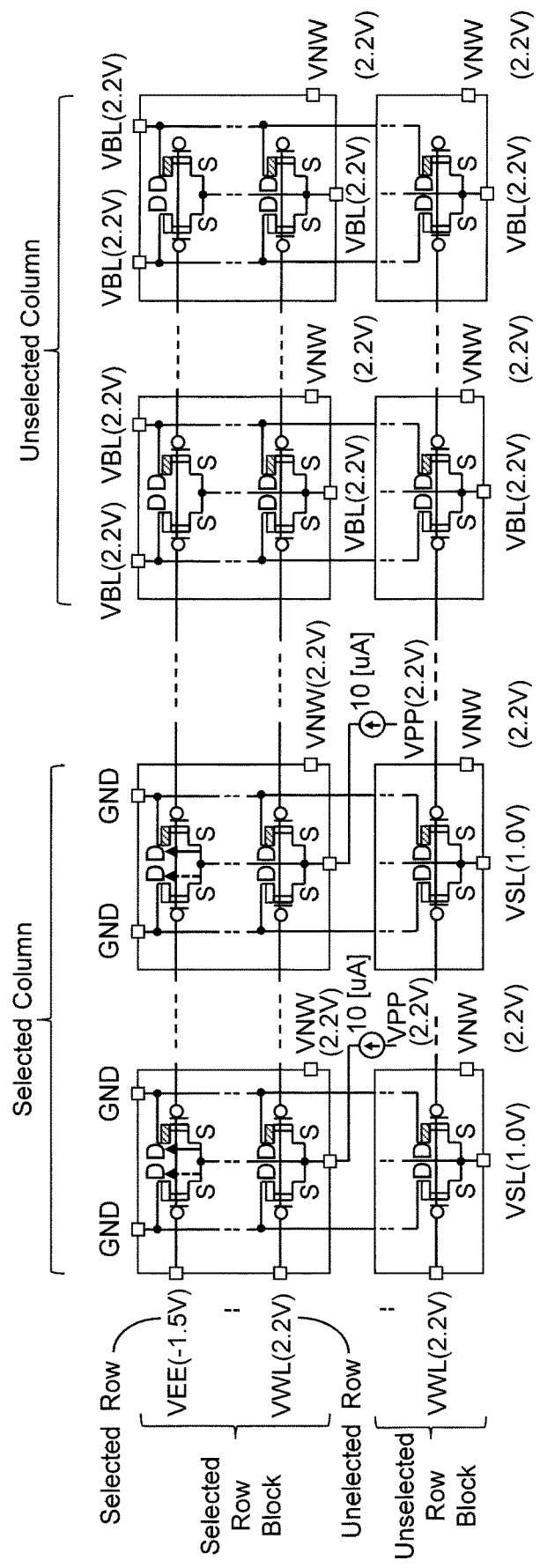
FIG. 33 is a diagram showing voltages and a current supplied to the memory cells during a read operation period of the semiconductor memory device according to the fourth embodiment.

FIG. 32 is a diagram illustrating voltages supplied to the memory cell during a read standby period of the semiconductor memory device according to the fourth embodiment. FIG. 33 is a diagram illustrating voltages supplied to the memory cells and currents supplied to the source line SL during the read operation period following the read standby period of the semiconductor memory device according to the fourth embodiment.

As shown in FIG. 32, during the read standby period, the voltage supplying circuit (the word line driving circuit 220, the column switch 230, the sense amplifier circuit 240, the source line driving circuit 260, and the well voltage driving circuit 1405) supplies VBL (2.2V) to all the bit line pairs, VWL (2.2V) to all the word lines WL, VBL (2.2V) to all the source lines SL, and VNW (2.2V) to all the n-type wells.

As shown in FIG. 33, during the read operation, the voltage supply circuit supplies GND (0V) to BLN and BLT connected to Selected Column memory cells and VBL (2.2V) to all the bit line pairs connected to the unselected memory cells. The voltage supply circuit provides a word line WL corresponding to the selected row with VEE (−1.5V) and continues to provide another unselected word line WL with VWL (2.2V). The voltage supply circuit supplies a constant current of 10 μA to the source line SL connected to the memory cells of Selected Column and selected row blocks, and supplies a VSL (1.0V) to the source line SL connected to the memory cells of Selected Column and unselected row blocks, and VBL (2.2V) to all other source lines SL. The voltage supply circuit continues to supply VNW (2.2V) to all n-type wells.

5-3. Fourth Embodiment (Configuration of Peripheral Circuit)

FIG. 34 is a circuit diagram of a source line driving element circuit 3400 included in the source line driving circuits 261 and 262 of the semiconductor memory device according to the fourth embodiment. The Standby signal, the Selected_Row_Block signal, a Read signal, an Erase signal, and the Program signal are supplied from the control circuit 270.

The source line driving element circuit 3400 includes a transfer gate 3410, a transfer gate 3420, a constant current supply circuit 3450, and a logic circuit for controlling the transfer gate.

The transfer gate 3410 consists of an n-type transistor 3411 and a p-type transistor 3412 connected in parallel, and is driven by a complementary signal generated by an inverter 3413 and supplies a voltage VBL to the source line SL.

The transfer gate 3420 consists of an n-type transistor 3421 and a p-type transistor 3422 connected in parallel, and is driven by a complementary signal generated by an inverter 3423 and supplies the voltage VSL to the source line SL.

The constant current supply circuit 3450 includes a constant current source including a resistor 3456 (which may be another constant current circuit) and a p-type transistor 3455 having a gate and a source connected thereto, and a p-type transistor 3454 having a gate commonly connected to the p-type transistor 3455. Since the p-type transistor 3455 and the p-type transistor 3454 are formed on the same semiconductor substrate, if the channel widths are equal, currents flowing through the both are equal. The current (10 μA) is supplied to the source line SL through a transfer gate which is composed of an n-type transistor 3451 and a p-type transistor 3452 connected in parallel and is driven by a complementary signal outputted from the logic circuit generated by the inverter 3458.

Logic circuit includes an inverter 3431, a NAND gate 3432, a NAND gate 3433, an inverter 3434, a NAND gate 3435, a NAND gate 3436, an inverter 3437, an inverter 3438, a NAND gate 3439, and a NAND gate 3440. The logic circuit controls to supply the constant current (10 μA) from the constant current supply circuit 3450 to the source line SL of the selected row block during the read operation. Furthermore, the control of the transfer gates 3413 and 3423 so as to supply VSL to the source line SL only in the unselected row block during the write operation and VBL to the source line in the other cases is same as that of the semiconductor memory device according to the third embodiment.

5-4. Effect of Fourth Embodiment

With the configuration as described above, the semiconductor memory device according to the fourth embodiment can improve the sensitivity of reading by supplying the constant current from the source in addition to the semiconductor device according to the fourth embodiment. As a result, it is possible to provide a semiconductor memory device with greatly improved reliability.

6. Fifth Embodiment

Although the first to fourth embodiments have been described above, in these embodiments, the voltage VEE of the selected word line during the read operation is fixed by, for example, −1.5V. However, when the write operation and the erase operation are repeated, the threshold value of the transistor constituting the memory cell fluctuates. Specifically, the absolute value of the threshold value gradually increases. This is because residual charges and interface states that cannot be erased are generated. However, this threshold variation may recover over time. Therefore, the optimum voltage of the selected word line is different immediately after the erase operation, several months, or several years later.

In order to solve the above problem, a part of rows of the memory cell array is partitioned as a region of a dummy cell. Then, predetermined data (for example, 10101010 . . . ) is written in the partition. Then, VEE of the dummy cell is read out, for example, in the range of −0.5V to −2V, and the range of VEE that does not cause a read-out error is measured, and the optimum VEE is reset within the range. This resetting may be performed in response to a trigger from an external system, or may be performed at a timing when a predetermined period of time elapses by storing a time stamp, or may be performed automatically at a timing of activation.

As an example of the resetting sequence, VEE is set to an initial value, the data in the area of the dummy cell is read out, and it is compared whether or not the data is predetermined data, and when a read error does not occur, the value is reset as VEE, and when a read error has occurred, the data is read out again as VEE=VEE+ΔVEE. This loop is then repeated.

The sequencing of VEE resetting may be controlled from a CPU or the like outside the semiconductor memory device, or may be controlled by providing a hardware sequencer inside the semiconductor memory device. In both cases, a register is required to control the voltage of VEE. Then, VEE is fluctuated by writing a value to the register.

As described above, by introducing VEE resetting sequence, it is possible to optimize the readout regardless of the variation of the threshold value of the semiconductor memory device.

Although the present invention has been described with reference to the drawings, the present invention is not limited to the above-described embodiments, and can be appropriately modified without departing from the spirit of the present invention. For example, a person skilled in the art appropriately adds, deletes, or changes in design of components based on the circuit of the present embodiment are included in the scope of the present invention as long as the present invention is provided. Furthermore, the above-described embodiments can be appropriately combined as long as there are no mutual contradictions, and technical matters common to the embodiments are included in the embodiments without explicit description.

It is to be understood that the present invention provides other operational effects that are different from the operational effects provided by the aspects of the above-described embodiments, and those that are obvious from the description of the present specification or those that can be easily predicted by a person skilled in the art.

What is claimed is:

1. A semiconductor memory device comprising:
a plurality of bit line pairs arranged in a column direction and each of the plurality of bit line pairs including a first bit line and a second bit line;
a plurality of source lines arranged in the column direction;
a plurality of word lines arranged in a row direction; and
a memory cell array including a plurality of memory cells arranged in the row and column directions,
wherein one of the plurality of memory cells includes a pair of transistors consisting of a first transistor and a second transistor formed on a first n-type well, a gate of the first transistor and a gate of the second transistor are both connected to a first word line which is one of the plurality of word lines, a first terminal of the first transistor is a first Schottky barrier junction consisting of a metal thin film formed on the first n-type well and connected to the first bit line, a second terminal of the first transistor is a p-type diffusion layer formed on the first n-type well, a first terminal of the second transistor is a second Schottky barrier junction consisting of a metal thin film formed on the first n-type well and connected to the second bit line, a second terminal of the second transistor is the p-type diffusion layer formed on the first n-type well, the second terminal of the first transistor and the second terminal of the second transistor are connected to each other while connected to one of the plurality of source lines.

2. The semiconductor storage device according to claim 1 further comprising:
a word line driving circuit for selecting one of the plurality of word lines and supplying the selected word line with a voltage lower than unselected word lines for both data writing and data reading;
a bit line driving circuit for supplying the first bit line with a voltage higher than the second bit line for data writing; and
a sense amplifier circuit for comparing a current flowing through the first transistor and a current flowing through the second transistor for data reading.

3. The semiconductor according to claim 1,
wherein another one of the plurality of memory cells includes a pair of transistors consisting of a third transistor and a fourth transistor formed on a second n-type well electrically isolated from the first n-type well, and a gate of the third transistor and a gate of the fourth transistor are both connected to the first word line.

4. The semiconductor according to claim 3 further comprising:
a well driving circuit for supplying different voltages to the first n-type well and the second n-type well.

5. The semiconductor according to claim 3,
wherein still another one of the plurality of memory cells includes a pair of transistors consisting of a fifth transistor and sixth transistor formed on a third n-type well electrically isolated from both of the first n-type well and the second n-type well, and a gate of the fifth transistor and a gate of the sixth transistor are both connected to the second word line which is different to the first word line.

6. The semiconductor according to claim 5 further comprising:
a well driving circuit for supplying different voltages to the first n-type well and the third n-type well.

7. The semiconductor according to claim 2 further comprising:
a constant current source;
a current mirror circuit mirroring a current flowing through the constant current source; and
a source lines driving circuit for supplying a current flowing through the current mirror circuit to one of the plurality of source lines.

8. The semiconductor according to claim 2 further comprising:
a register controlling a voltage;
wherein the word line driving circuit supplies the selected word line with the low voltage controlled according to a value written to the register for data reading.

* * * * *